United States Patent
Manusharow et al.

(10) Patent No.: US 9,633,938 B2
(45) Date of Patent: Apr. 25, 2017

(54) HYBRID PITCH PACKAGE WITH ULTRA HIGH DENSITY INTERCONNECT CAPABILITY

(71) Applicant: INTEL CORPORATION, Santa Clara, CA (US)

(72) Inventors: Mathew J. Manusharow, Phoenix, AZ (US); Daniel N. Sobieski, Phoenix, AZ (US); Mihir K. Roy, Chandler, AZ (US); William J. Lambert, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/866,491

(22) Filed: Sep. 25, 2015

(65) Prior Publication Data

US 2017/0092573 A1    Mar. 30, 2017

(51) Int. Cl.
*H01L 23/52* (2006.01)
*H01L 23/498* (2006.01)
(Continued)

(52) U.S. Cl.
CPC .. *H01L 23/49838* (2013.01); *H01L 21/02263* (2013.01); *H01L 21/28556* (2013.01); *H01L 21/32* (2013.01); *H01L 21/3205* (2013.01); *H01L 21/768* (2013.01); *H01L 23/49816* (2013.01); *H01L 23/49822* (2013.01); *H01L 23/49827* (2013.01); *H01L 24/11* (2013.01); *H01L 24/16* (2013.01)

(58) Field of Classification Search
CPC ......... H01L 23/49822; H01L 23/49827; H01L 23/49816; H01L 24/11; H01L 24/16

USPC ......................................................... 257/737
See application file for complete search history.

(56) References Cited

U.S. PATENT DOCUMENTS 6,107,685 A * 8/2000 Nishiyama ............ H01L 21/563
257/737
6,787,918 B1  9/2004 Tsai et al.
(Continued)

OTHER PUBLICATIONS

Intel Corporation, "PCT Search Report and Written Opinion", International Application No. PCT/US2016/044511, (Oct. 31, 2016).

*Primary Examiner* — Luan C Thai
(74) *Attorney, Agent, or Firm* — Blakely, Sokoloff, Taylor & Zafman LLP

(57) ABSTRACT

A hybrid pitch package includes a standard package pitch zone of the package having only standard package pitch sized features that is adjacent to a smaller processor pitch sized zone of the package having smaller processor pitch sized features. The package may be formed by obtaining a package having standard package pitch sized features (such as from another location or a package processing facility), forming a protective mask over a standard package pitch zone of the package that is adjacent to a smaller processor pitch sized zone on the package, and then forming smaller processor pitch sized features (such as contacts, traces and interconnects) in the smaller processor pitch sized zone at a chip fabrication processing facility. The smaller processor pitch sized features can be directly connected to (thus reducing the package connection area needed) a chip or device having processor pitch sized features (e.g., exposed contacts).

22 Claims, 14 Drawing Sheets

(51) Int. Cl.
*H01L 23/00* (2006.01)
*H01L 21/02* (2006.01)
*H01L 21/32* (2006.01)
*H01L 21/768* (2006.01)
*H01L 21/3205* (2006.01)
*H01L 21/285* (2006.01)

(56) References Cited

U.S. PATENT DOCUMENTS

| | | | | |
|---|---|---|---|---|
| 7,564,130 | B1* | 7/2009 | Li | H01L 24/14 |
| | | | | 257/734 |
| 7,687,803 | B2* | 3/2010 | Takagi | G01R 1/0491 |
| | | | | 257/48 |
| 7,874,847 | B2* | 1/2011 | Matsui | H01R 13/2421 |
| | | | | 439/60 |
| 8,686,560 | B2* | 4/2014 | Parvarandeh | H01L 24/06 |
| | | | | 257/737 |
| 8,791,579 | B2* | 7/2014 | Lai | H01L 23/488 |
| | | | | 257/738 |
| 2009/0004840 | A1 | 1/2009 | Farinelli et al. | |
| 2010/0155893 | A1 | 6/2010 | Chen et al. | |
| 2010/0279500 | A1 | 11/2010 | Han | |
| 2013/0032949 | A1 | 2/2013 | Lin et al. | |

* cited by examiner

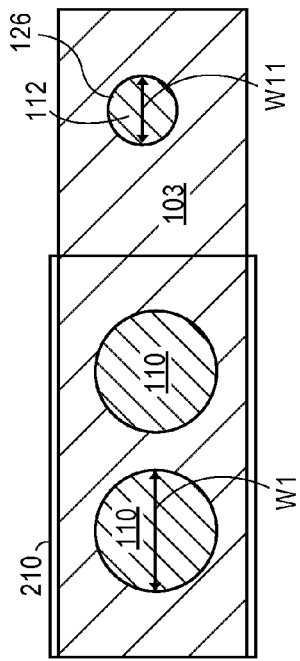
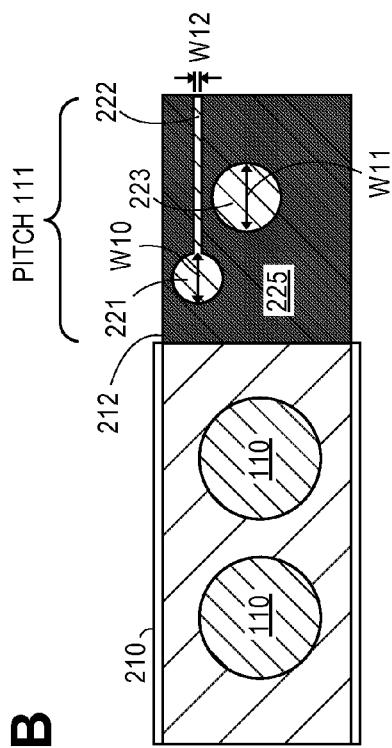
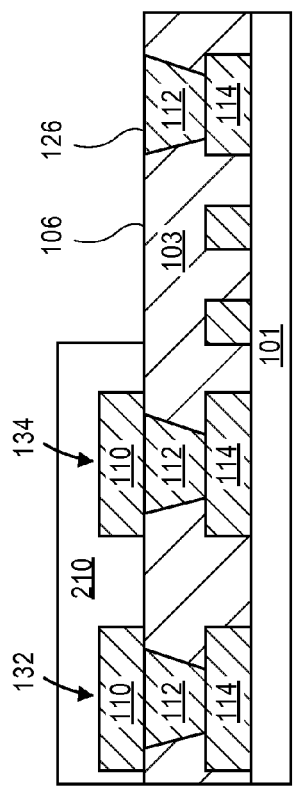
FIG. 2B
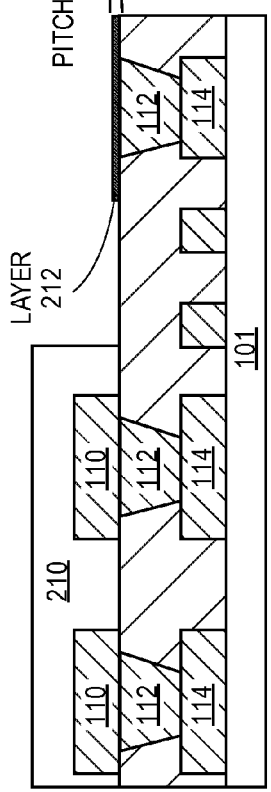
FIG. 2C

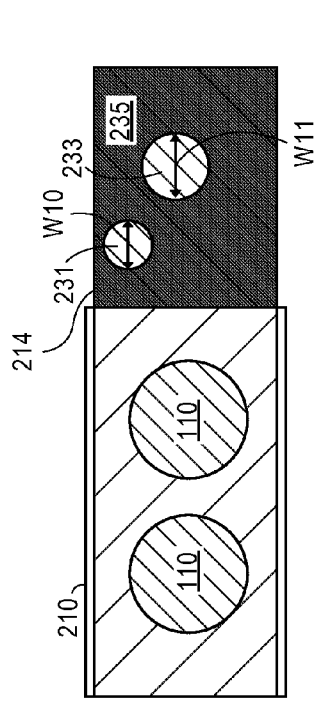
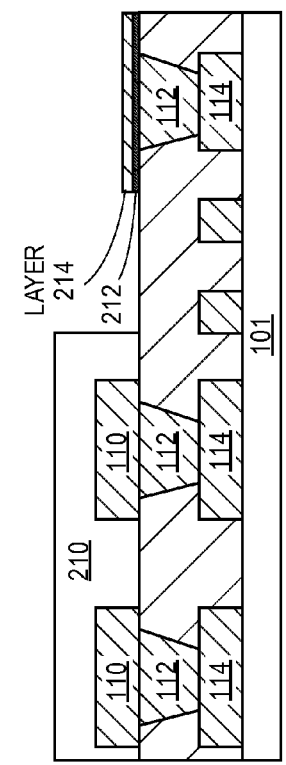
FIG. 2D
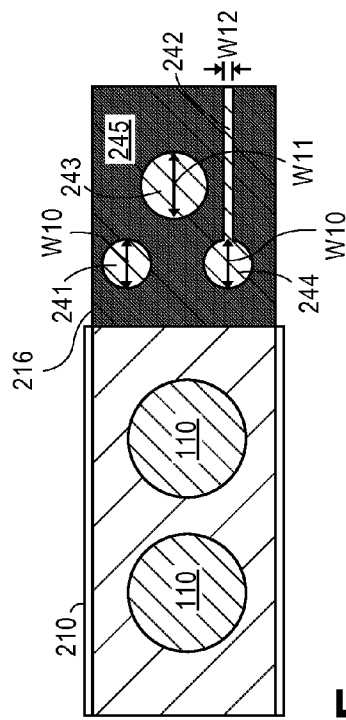
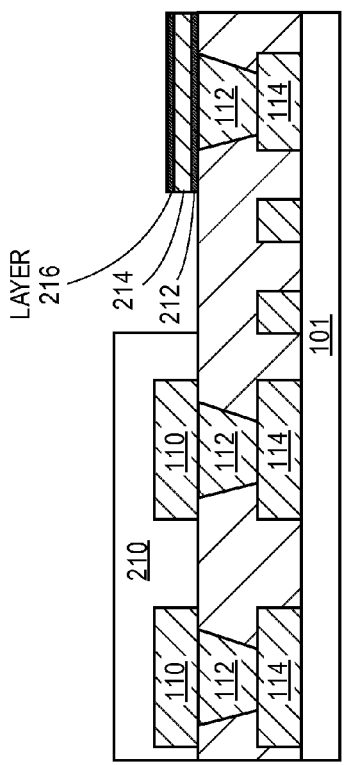
FIG. 2E

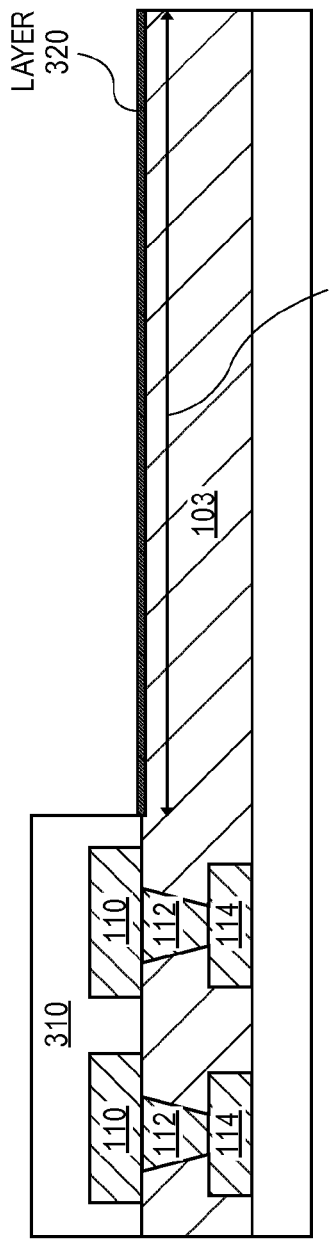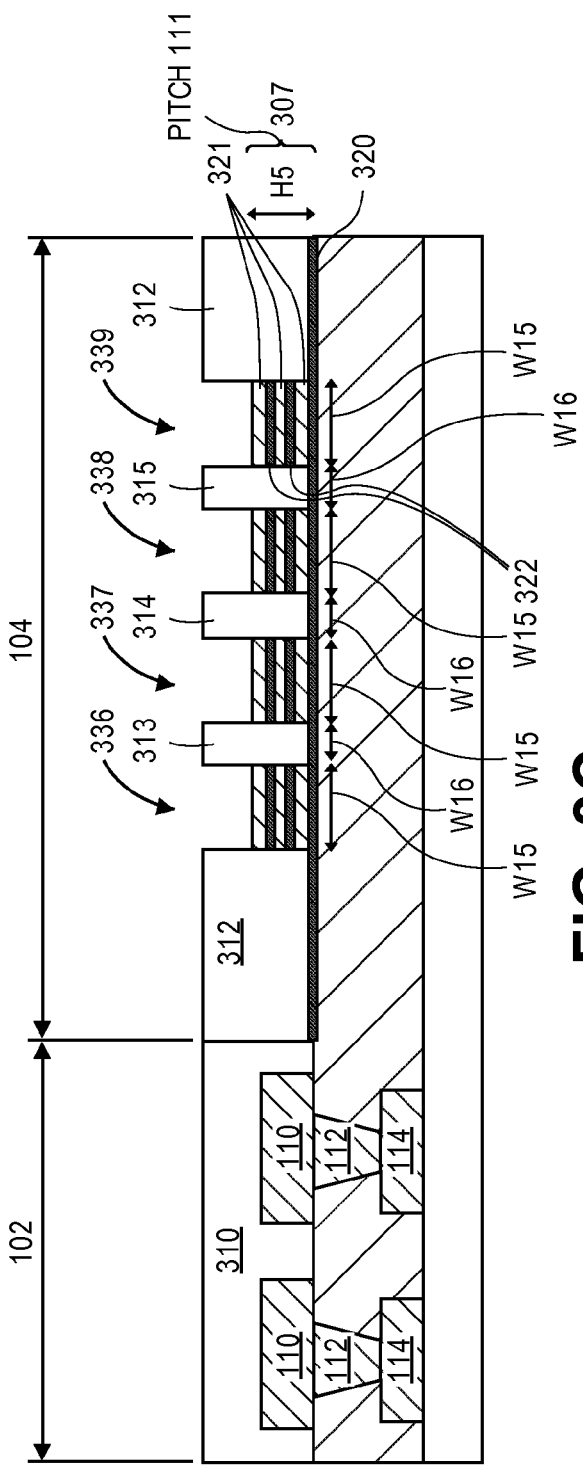

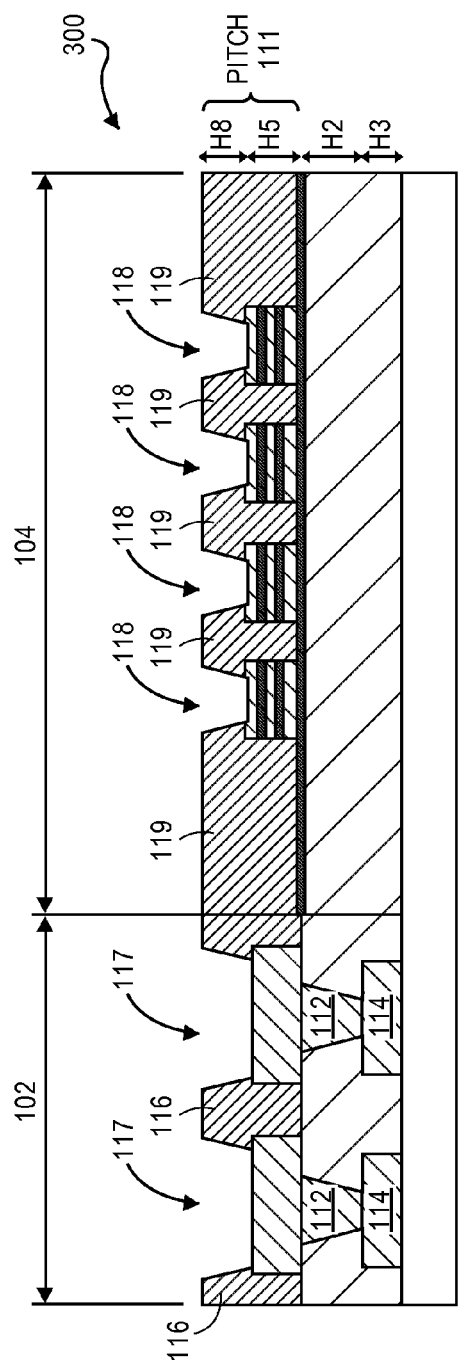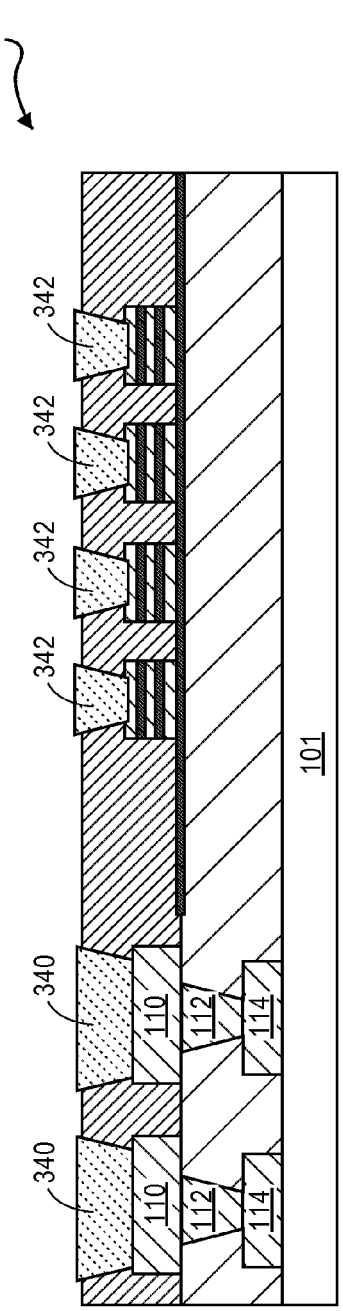

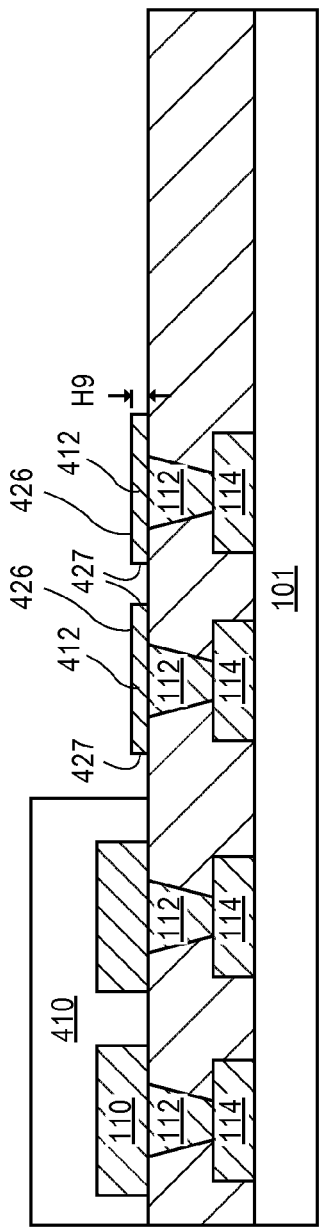
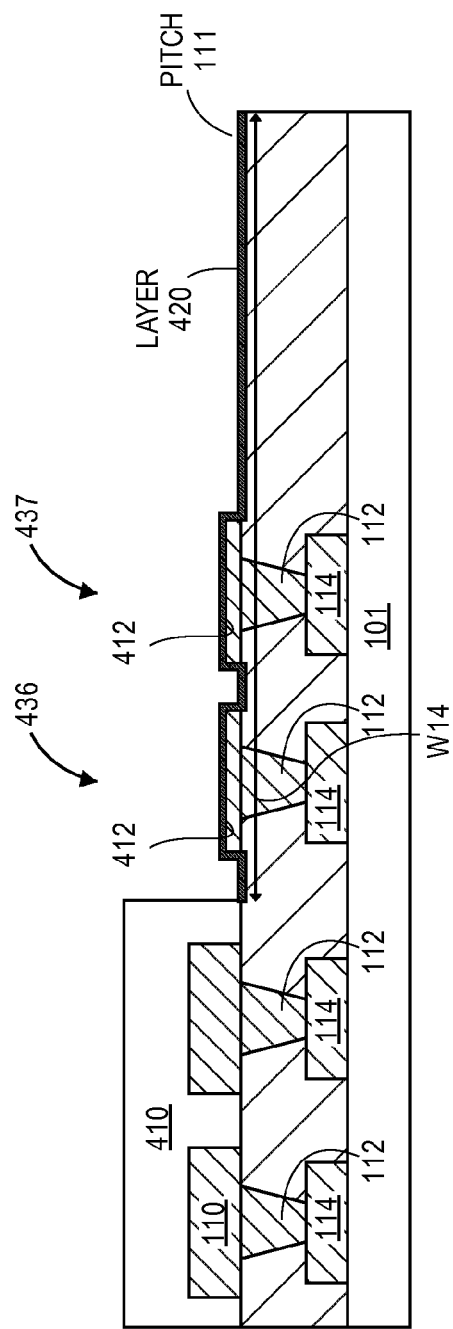

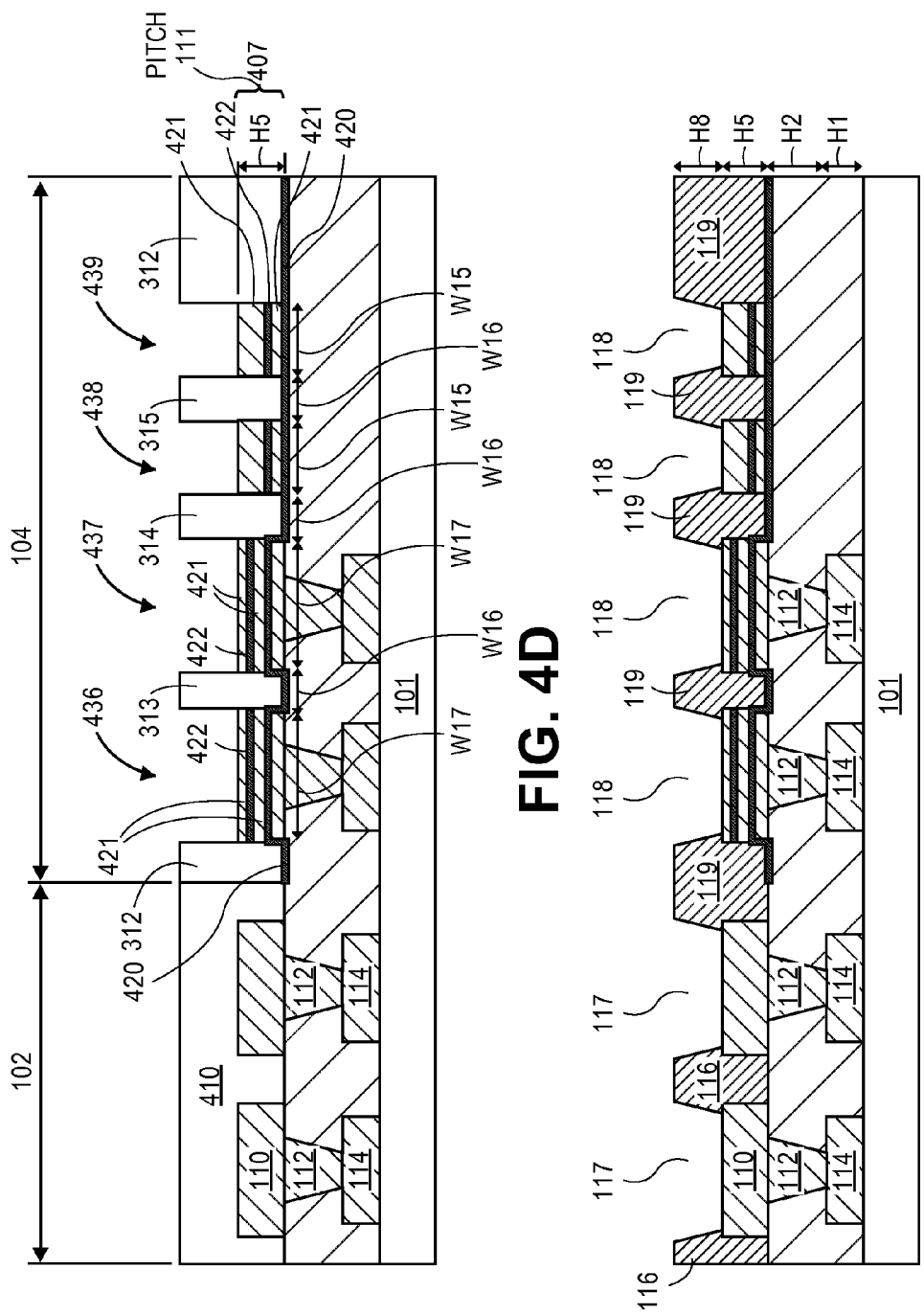

|  | Zone 102 | Zone 104 |
|---|---|---|
| H1 One Layer of BU Cu (feature 110) | 15 | - |
| H2 One Layer of BU (ABF) (feature 112) | 25 | 25 |
| 1st Nitride passivation (feature 120, 320, 420) | - | 0.2 |
| Five layers of sputtered Cu (2um each) (each of feature 121, 212-216, 321, 421) | - | 2x5=10 |
| Four layers of nitride (0.2um each) (each of feature 122, 322, 422) | - | 2x0.2=0.8 |
| H7 Final layer of pad thickness (feature 123) | - | 6 |
| H4/H8 SR on final layer (feature 116, 119) | 18 (H4) | 16 (H8) |
| Total thickness | 58 | 58 |

Brackets: H1+H2 = PITCH 109; the nitride passivation, sputtered Cu, nitride, and final pad rows = PITCH 111. H5 spans the middle group; H6 spans the sputtered Cu + nitride rows.

FIG. 5

HYBRID PITCH PACKAGE WITH ULTRA HIGH DENSITY INTERCONNECT CAPABILITY

BACKGROUND

Field

Embodiments of the invention are related in general, to semiconductor device packaging and, in particular, to substrate packages and printed circuit board (PCB) substrates upon which an integrated circuit (IC) chip may be directly attached, and methods for their manufacture. The package may be a hybrid pitch package having a top interconnect layer with standard package pitch features formed a zone of a substrate that is adjacent to a "hybrid" zone having standard package pitch features and top layers with reduced pitch features to which an IC chip may be directly attached.

Description of Related Art

Integrated circuit (IC) chips (e.g., "chips", "dies", "ICs" or "IC chips"), such as microprocessors, coprocessors, and other microelectronic devices often use package devices ("packages") to physically and/or electronically attach the IC chip to a circuit board, such as a motherboard (or motherboard interface). The IC chip (e.g., "die") is typically mounted within a microelectronic substrate package that, among other functions, enables electrical connections between the die and a socket, a motherboard, or another next-level component.

There is a need in the field for an inexpensive and high throughput process for manufacturing such packages. In addition, the process could result in a high package yield and a package of high mechanical stability. Also needed in the field, is a package having better components for providing stable and clean power, ground, and high frequency signals between its top and bottom surfaces, such as to contacts on the surfaces that will be electrically connected to an IC or motherboard.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIG. 2B shows the package of FIG. 2A after removing a standard package pitch contact from over a via contact in a reduced pitch zone.

FIG. 2C shows the package of FIG. 2B after forming a first layer of conductive material and dielectric material in a reduced pitch zone.

FIG. 2D shows the package of FIG. 2C after forming a second layer of conductive material and dielectric material in a reduced pitch zone.

FIG. 2E shows the substrate of FIG. 2D after forming a third layer of conductive material and dielectric material in a reduced pitch zone.

FIG. 3B shows the package of FIG. 3A after forming a first layer of dielectric material in a reduced pitch zone.

FIG. 3C shows the package of FIG. 3B after forming alternating layers of conductive material and dielectric material in a reduced pitch zone.

FIG. 3D shows the package of FIG. 3C after forming a solder resist layer over a final layer of conductive material (and optionally dielectric material) in a standard package pitch zone and a reduced pitch zone.

FIG. 3E shows the package of FIG. 3D after forming solder in openings in a solder resist layer over a final layer of conductive material (and optionally dielectric material) in a standard package pitch zone and a reduced pitch zone.

FIG. 4B shows the package of FIG. 4A after removing a height but not all of a standard package pitch contact from over via contacts in a reduced pitch zone.

FIG. 4C shows the package of FIG. 4B after forming a first layer of dielectric material in a reduced pitch zone.

FIG. 4D shows the package of FIG. 4C after forming alternating layers of conductive material and dielectric material in a reduced pitch zone.

FIG. 4E shows the package of FIG. 4D after forming a solder resist layer over a final layer of conductive material (and optionally dielectric material) in a standard package pitch zone and a reduced pitch zone.

FIG. 5 shows some examples for the height, or thicknesses of the various layers of various embodiments, as shown in FIGS. 1-4.

DETAILED DESCRIPTION

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

As IC chip or die sizes shrink and interconnect densities increase, physical and electrical connections between the integrated circuit (IC) chip and a socket, a motherboard, or another next-level component, require scaling so as to match both the smaller pitches typically found at the die and the larger pitches typically found at the next-level component.

The IC chip may be mounted within or on a microelectronic substrate package, which is also physically and electronically connected to the next-level component. Thus, such packages may encounter very high density interconnect problems. In some cases, high density interconnection packages may be used for system on a chip (SoC). Here, in many cases across client and server, the package must route hundreds or even thousands of signals between two die.

Some embodiments for providing such a "package" are to use a silicon interposer, a silicon bridge, or an organic interposer technology. Each of these technologies has their at least one challenge, and the common challenge to all is their high cost. Since, both the client and SoC do not have any aligned technologies for high density interconnect demand; a lower cost high density interconnects solution is needed across these segments. Even, under certain cases slightly lower interconnect density than the peak capability at a lower cost is an adequate solution.

To solve these and other problems, some embodiments herein describe "hybrid pitch package" semiconductor packages (e.g., devices, systems and processes for forming) that provide all the benefits of a silicon interposer and a silicon bridge, while having a lower cost manufacturing process that can use computer processor fabrication processing, processes and facilities to enable ultra-high density interconnect across the package (e.g., board), from standard package pitch sized features to smaller processor or reduced pitch sized features. The hybrid package may have a top interconnect layer with a standard package pitch zone 102 adjacent to reduced pitch zone formed upon the same substrate. In some cases, the reduced pitch zone is a "hybrid" zone having lower layers with standard package pitch features and top layers with reduced pitch features to which an IC chip may be directly attached.

Figure 1:
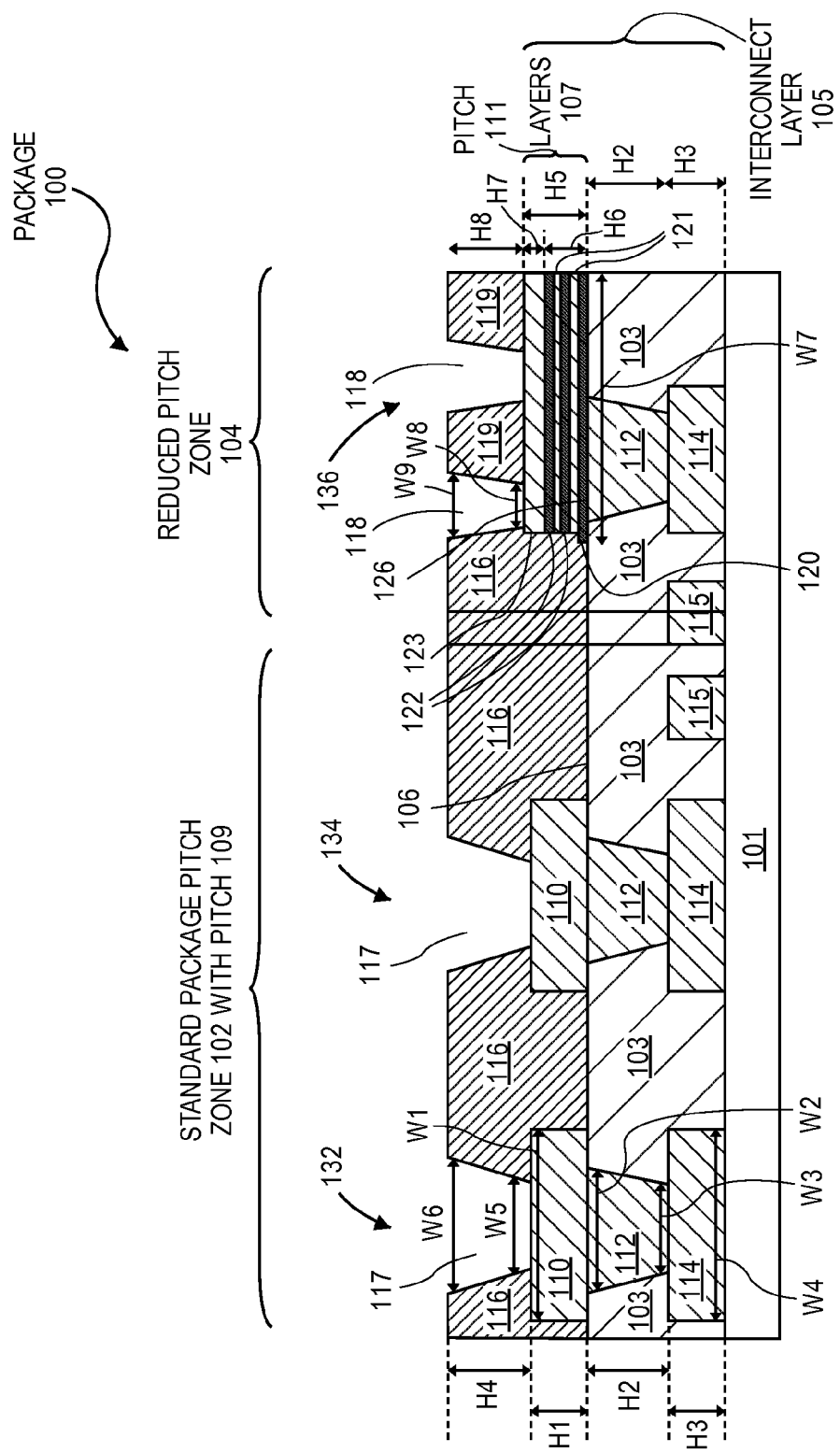
FIG. 1 is a schematic cross-sectional side view of a semiconductor device package upon which an integrated circuit (IC) chip or "die" may be directly attached.

FIG. 1 is a schematic cross-sectional side view of a semiconductor device package upon which an integrated circuit (IC) chip or "die" may be directly attached. FIG. 1 shows package 100 having package substrate 101 upon which top or topmost interconnect layer 105 is formed. Layer 105 may be considered to "top" layer such as a top or exposed layer (e.g., a final build-up (BU) layer, BGA, LGA, or die-backend-like layer) to which an IC chip, a socket, an interposer, a motherboard, or another next-level component will be mounted or directly attached. Substrate 101 may be or include various packaging layers, standard package pitch sized features, smaller processor (or reduced) pitch sized features, conductive features (e.g., electronic devices, interconnects, layers having conductive traces, layers having conductive vias), layers having dielectric material and other layers as known in the industry for a semiconductor device package.

According to embodiments, package 100 has interconnect layer 105 with a standard package pitch zone 102 adjacent to reduced pitch zone 104 formed upon the same substrate 101. In some cases, zone 104 is a "hybrid" zone having lower layers with standard package pitch 109 features and top layers with reduced pitch 111 features to which an IC chip may be directly attached. Interconnect layer 105 may be or include one or more layers of interconnects, conductive features (e.g., electronic devices, interconnects, layers having conductive traces, layers having conductive vias), layers having dielectric material and other layers as known in the industry for an interconnect layer or semiconductor device package, formed on or over substrate 101. In some cases, the conductive features of layer 105 are electrically connected to (e.g., physically attached to or formed onto) the conductive features of substrate 101.

Layer 105 has standard package pitch zone 102 (e.g., an area from above, see FIG. 2) adjacent to reduced pitch zone 104 (e.g., a different area from above, see FIG. 2). Zones 102 and 104 may be formed upon the same substrate 101. Layer 105 has a layer of dielectric 103; and conductive upper contact 110 or reduced pitch layers 107 formed on a conductive via contact 112 formed on a conductive lower contact 114. Zone 102 may have only standard package pitch sized features, while zone 104 has some standard package pitch sized features as well as smaller processor (or reduced) pitch sized features. Since zone 104 had features with multiple pitches, it may be described as a "hybrid" zone or zone formed by a hybrid process (e.g., standard packaging as well as chip processing). Such features may include to conductive upper contacts, via contacts, and lower contacts; conductive traces, layers of conductive material, layers of dielectric material, layers of combined conductive and dielectric material, layers that form capacitors, and the like.

Layer 105 may be a final build-up (BU) layer, BGA, LGA, or die-backend-like layer and have zone 104 (e.g., layers 107) to which layers or features within (e.g., having a pitch smaller than that of a chip package) a die or chip may be directly attached (e.g., soldered to; or physically and electronically directly attached to). These features may be (e.g., have a pitch) smaller than (e.g., and not be) those typically on the exterior, exposed surface, final build-up (BU) layer, ball grid array (BGA), land grid array (LGA), or "die-backend-like" layer of a die or chip. They may be smaller by a magnitude of between 5 and 15 times. They may have pitch 111 for directly attaching to the pitch of a die (e.g., IC, chip, processor, or central processing unit).

Layer 105 may have upper contact 110 or layers 107 extending above a top surface 106 of dielectric 103. Layer 105 may have upper contact 110 or layers 107 over and electrically connected to conductive via contact 112, which is electrically connected to conductive lower contact 114. Contacts 112 and 114 may be disposed within dielectric 103, below surface 106. Zone 104 may include lower layers having standard packaging pitch 109 as well as upper layers 107 having reduced pitch 111. Thus, zone 104 may also be described as a "hybrid" zone (e.g., having layers with pitch 109 and 111) in the same substrate as standard package pitch zone 102. In some cases, package 100 is described as a hybrid semi-addative processing or packaging (SAP) pitch package with ultra high density interconnect capability (e.g., at zone 104) by having reduced pitch zone 104 (e.g., a different area from) adjacent to zone 102.

Layer 105 is shown having layer 103 of dielectric material, in which are formed or having contact 112 formed on contact 114 in zones 102 and 104. FIG. 1 also shows conductive traces 115, which may represent other packaging conductive tracers or layers that may be in zone 102 and 104. Lower contact 114 (and optionally traces 115) may contact the various electronics of substrate 101. In some cases, contacts 114 (and traces 115) may be contacts to or may represent conductive wires, routing or traces extending (e.g., within substrate 101) to other interconnects, contacts, or electronic devices on or in substrate 101.

FIG. 1 shows interconnects 132 and 134 formed over package substrate 101 in zone 102; and interconnects 136 formed over package substrate 101 in zone 104. Interconnects 132 and 134 have upper contacts 110, conductive via contacts 112, and conductive lower contacts 114. Interconnect 136 has reduced pitch layers 107, conductive via contact 112, and conductive lower contact 114.

Upper contact 110 has height (e.g., vertical thickness of solid material) H1 and width, W1. Upper contact 110 is formed on and electrically connected to (e.g., touching or in direct contact with) electrical conducting via contact 112. Via contact 112 has height, H2, upper width, W2, and lower width, W3. Via contact 112 is formed on and electrically connected to contact 114. Contact 114 has height, H3, and width, W4. Layers 107 have height H5 and width, W7. Layers 107 are further described below.

Solder resist 116 is shown formed over top surface 106 of dielectric 103. Solder resist 116 may have height (e.g., vertical thickness), H4, above the top surface of contacts 110 of interconnects 132 and 134. Solder resist 116 may have a total height over surface 106 that is H1+H4. Openings 117 are shown formed through solder resist 116 above and exposing a top surface of contacts 110 of interconnects 132 and 134. Openings 117 may have a lower width of W5 and an upper width of W6. In some cases, W5 is equal to W1.

Solder resist 119 is shown formed over a top surface of layers 107. Solder resist 119 may have height (e.g., thickness), H8, above the top surface of layer 132 of interconnect 136. Openings 118 are shown formed through solder resist 119 (and the side of resist 116) above and exposing a top surface of layer 132 of interconnect 136 (e.g., of layers 107). Openings 118 may have a lower width of W8 and an upper width of W9.

In some cases, width W7 is between 1 millimeter (mm) and 20 mm. In some cases, width W7 can span an entire width of a die or chip. In some cases, width W8 is between 10 and 50 micrometers (μm). In some cases, width W9 is between 20 and 70 micrometers. Widths W7, W8 and W9 may have pitch 111 and/or be formed using a chip POR.

Resists 116 and 119; and openings 117 and 118 may be formed at the same time or during the same processing processes. In some cases, resist 116, resist 119, openings 117 and openings 118 may all be formed by a process known for forming pitch 111 and/or using a chip POR; however, resist 116 and openings 117 may be formed with pitch 109 while resist 119 and openings 118 are formed with pitch 111.

Layer 105 has standard package pitch zone 102 adjacent to reduced pitch zone 104. Zone 102 has standard package pitch 109 and zone 104 has smaller, reduced pitch 111. Standard pitch zone 102 may have standard package pitch sized features (e.g., having pitch 109), and reduced pitch zone 104 may have smaller processor die pitch sized features (e.g., having pitch 111). In some cases, features of zone 102 and 104 may be or include contacts, interconnects, traces, solder resist openings, and solder having height (e.g., thickness), width (e.g., diameter), length (e.g., into the page) or spacing that define a pitch (e.g., have pitch 109 and 111).

In some embodiments, pitch 109 or 111 may be defined as width and length of a feature in zone 102 or zone 104 (or layers 107, 307 or 407), respectively. In some cases it refers to the height of such a feature. In some cases it refers to a combination of all three. In some cases it refers to a line width, line spacing or line pitch of a feature. Such a pitch may be from the center of one line or trace formed to the center of the adjacent line or trace. Such a pitch may be the minimum pitch formable by the (standard packaging for zone 102 or chip for zone 104) design rule.

In some embodiments, pitch 109 may be defined as the distance between center points of adjacent upper (e.g., exposed) contacts 110 or of openings 117; as an average of the height of contacts or layers of zones 102; or a pitch determined by a standard package design rule (DR) for the contacts or layers of zone 102. In some cases, pitch 109 is a line spacing (e.g., the actual value of the line widths and spaces between lines on the layers) or design rules (DR) of a feature (e.g., conductive contact, or trace) that is between 9 and 12 micrometers. In some cases, pitch 109 is allows for "flip chip" bonding (e.g., using solder in openings 117), also known as controlled collapse chip connection (C4) bump scaling such as for interconnecting semiconductor devices, such as IC chips and microelectromechanical systems (MEMS), to external circuitry with solder bumps that have been deposited onto the chip pads. In some cases, pitch 109 is a bump pitch of (e.g., using solder in openings 117) between 130 micrometers and 200 micrometers. In some cases, pitch 111 is a bump pitch of between 30 and 70 micrometers. In some cases, the processor pitch sized features of zone 104 (or layers 107, 307 or 407) have a bump pitch 111 of between 10 and 50 micrometers, and the standard package pitch sized features of zone 102 have a bump pitch 109 of between 100 micrometers and 200 micrometers. In some cases, the processor pitch sized features of zone 104 (or layers 107, 307 or 407) have a bump pitch 111 formed according to a chip POR and having a height of less than 10 micrometers; and the standard package pitch sized features of zone 102 have a bump pitch 109 formed according to standard package POR and include conductive upper contacts having a height of at least 10 micrometers. In some cases, the processor pitch sized features of zone 104 (or layers 107, 307 or 407) have a height pitch 111 for dielectric layers having a thickness of between 0.1 and 0.3 micrometers, and for conductive material layers having a thickness of between 1 and 3 micrometers.

In some embodiments, pitch 111 may be defined as the distance between center points of adjacent upper (e.g., exposed) contacts in zone 104 or of openings 118; as an average of the height of contacts or layers of zone 104; or a pitch determined by a chip processing design rule (DR) for the contacts or layers of zone 104. In some cases, pitch 111 is a line spacing (e.g., the actual value of the line widths and spaces between lines on the layers) or design rules (DR) of a feature (e.g., conductive contact, or trace of layers 107, 307 or 407) that is between 2 and 4 micrometers. Pitch 111 may be a pitch formed by processing used to form an active semiconductor device (e.g., transistor), microprocessor, die, or chip.

In some cases, pitch 111 is small enough to directly connect (e.g., using solder in openings 118) to small pitch on parts like high bandwidth memory (HBM), or wide input/output version 2 (WIO2) memory, or anything else that can take advantage of the super small pitch. In some cases, pitch 111 is small enough to form direct die-to-die connections needing massive bandwidth, such as by being the same pitch as that of in internal layer of a die. In some cases, pitch 111 is a bump pitch of (e.g., using solder in openings 118) between 10 micrometers and 70 micrometers. In some cases, pitch 111 is a bump pitch of 100 micrometers or smaller.

In some cases, pitch 111 is between 20 and 90 percent smaller than pitch 109. In some cases, it is between 40 and 70 percent smaller. In some cases it is at least three times as small. In some cases, pitch 111 is between 2 and 4 times smaller than pitch 109. In some cases, pitch 111 includes features that are 5, 10 or 15 times smaller than pitch 109. In some cases they are 5-10 time smaller.

Zone 102 may have features having standard package pitch 109 as known for a semiconductor die package, chip package; or for another device (e.g., interface, PCB, or interposer) typically connecting a die (e.g., IC, chip, processor, or central processing unit) to a socket, a motherboard, or another next-level component. In some cases, zone 102 has features with a pitch 109 to be used for interfacing (e.g., physically and electronically connecting) zone 102 with a die package, a socket, a motherboard, or another next-level component. Pitch 109 may be know according to a standard for chip or die packages. Pitch 109 may be as known according to the industry's standards for a die package, such as by having an upper contact 110 having height, H1 of approximately 15 micrometers (15×E-6 meter—"µm") and a width W1 of between 70 and 120 µm. In some cases, H2 is approximately 25 micrometers, W2 is between 40 and 100 µm, and W3 is between 30 and 70 µm. In some cases, H3 is approximately 15 micrometers, and W4 is between 50 and 100 µm. In some cases, H4 is approximately 18 micrometers, W5 is between 60 and 100 µm, and W6 is between 70 and 100 µm.

Zone 102 is shown having features: dielectric 103, conductive upper contacts 110, conductive via contacts 112, conductive lower contacts 114, trace 115, resist 116, and openings 117, which may all have pitch 109 according to industry standards for a die package. According to some embodiments, upper contacts 110, dielectric 113, conductive via contacts 112, conductive lower contacts 114, traces 115 and resist 116 are formed according to a package forming process, recipe or "plan of record" (POR), such as for forming standard package pitch 109. This package POR may include forming masks (masking) and forming openings in those features or the masks as noted herein to form features with pitch 109. According to some embodiments, this package POR may refer to processing, a design rule (DR), vias, interconnects, interconnect layers, feature sizes, or pitch to form the features in zone 102 as described herein.

Contact 110, 112 and 114; and trace 115 may each be a height (e.g., thickness) of solid conductive material. Such material may be or include copper (Cu), gold, silver, bronze, nickel, silver, aluminum, molybdenum, an alloy, or the like as known for such a contact. In some cases, they are all copper.

The contacts and traces may be a blanket layer that is masked and etched to form the contacts; or may be a layer that is formed within openings in a mask, and the mask then removed (e.g., dissolved or burned) to form the contacts. In some cases, the contacts and traces may be formed by a process known to form such contacts and traces of a package or package pitch device.

Dielectric 103, may each be a height (e.g., thickness) of solid non-conductive material. Such material may be or include silicon nitride, silicon dioxide, porcelain, glass, plastic, or the like as known for such a dielectric. In some cases it is silicon nitride.

The dielectric may be a blanket layer that is masked and etched to form openings where the contacts are deposited, grown or formed. Alternatively, the dielectric may be a layer that is formed on a patterned mask, and the mask then removed (e.g., dissolved or burned) to form openings where the contacts are deposited, grown or formed. In some cases, the dielectric may be formed by a process known to form such a dielectric of a package.

Resist 116, may each be a height (e.g., thickness) of solid non-conductive solder resist material. Such material may be or include an epoxy, an ink, a resin material, a dry resist material, a fiber base material, a glass fiber base material, a cyanate resin and/or a prepolymer thereof; an epoxy resin, a phenoxy resin, an imidazole compound, an arylalkylene type epoxy resin or the like as known for such a solder resist. In some cases it is an epoxy or a resin.

The resist may be a blanket layer that is masked and etched to form openings where solder can be formed on and attached to the upper contacts, or where parts can be soldered to the upper contacts. Alternatively, the resist may be a layer that is formed on a mask, and the mask then removed to form the openings. In some cases, the resist may be a material (e.g., epoxy) liquid that is silkscreened through or sprayed onto a pattern (e.g., mask) formed on the package; and the mask then removed (e.g., dissolved or burned) to form the openings. In some cases, the resist may be a liquid photoimageable solder mask (LPSM) ink or a dry film photoimageable solder mask (DFSM) blanket layer sprayed onto the package; and then masked and exposed to a pattern and developed to form the openings. In some cases, the resist goes through a thermal cure of some type after the openings (e.g., pattern) are defined. In some cases the resist is laser scribed to form the openings. In some cases, the resist may be formed by a process known to form such a resist of a package.

Zone 104 may include features having a pitch (e.g., reduced pitch 111) as known for an IC, die, processor, central processing unit, or chip device. This pitch may be smaller than and exclude a pitch for zone 102, such as by being the pitch prior to the final build up layer (e.g., interface or contacts to) to contact a die package. Pitch 111 may be a pitch for a system on a chip (SoC); for electrically connecting across client and server; for electrically connecting hundreds or even thousands of signals that are routed between two die. In some cases, zone 104 has features (e.g., at height H2-H3, such as dielectric 103, contact 112, contact 114 and trace 115) with pitch 109 as noted above for zone 2; and other features (e.g., height H5 and optionally H8, such as layers 107 and optionally resist 119) with pitch 111.

In some cases, layers 107 have reduced pitch 111 used for interfacing (e.g., physically and electronically connecting) between or within layers (e.g., not a final, exposed, final build-up (BU) layer, BGA, LGA, or die-backend-like layer) of an IC, die, processor, central processing unit, or chip device. Pitch 111 may be know according to a standard for chip or die devices. Pitch 111 may be as known according to the industry's standards such as by having some layers of dielectric and conductor having height of approximately 0.2 and 2 micrometers (×E-6 meter) respectively; width W8 of an exposed contact or area of layer 123 of between 10 and 50 µm, and width W9 of between 15 and 70 µm. In some cases, H5 is approximately 17 micrometers. In some cases, it is between 6 and 20 µm. In some cases, it is between 6 and 15 µm. In some cases, H6 is approximately 11 micrometers. In some cases, it is between 4 and 15 µm. In some cases, it is between 4 and 10 µm. In some cases, H7 is approximately 6 micrometers. In some cases, it is between 2 and 8 µm. In some cases, it is between 4 and 6 µm. In some cases, H8 is approximately 16 micrometers. In some cases, it is between 6 and 25 µm. In some cases, it is between 10 and 20 µm.

Zone 104 is shown having features: dielectric 103, conductive via contacts 112, conductive lower contacts 114, traces 115, and solder resist 116, which may all pitch 109. In some cases, these features have a pitch and are formed according to a process recipe or plan of record (POR) as described above for zone 102. Zone 104 is also shown having features: reduced pitch layers 107, resist 119, and openings 118, which may all have pitch 111 according to the industry's standards for layers within a die or chip.

According to some embodiments, reduced pitch layers 107, resist 119, and openings 118 are formed according to a chip forming process, recipe or plan of record (POR), such as for forming reduced pitch 111. This process or POR may include a process for forming an integrated circuit chip, die, processors, central processing unit. In some cases, layers 107 (and optionally resist 119 and openings 118) are formed after removing upper contact 110 from interconnect contact 112 in zone 104. This chip POR may include forming masks (e.g., masking) and forming openings in those features or the masks as noted herein to form features with pitch 111. According to some embodiments, this chip POR may refer to processing, a design rule (DR), vias, interconnects, interconnect layers, feature sizes, or pitch to form the features in layer 107 (and optionally resist 119) as described herein.

Reduced pitch layers 107 have height, H5 (e.g., above surface 106 or the top of contact 112), and width, W7. Height H5 may be a total thickness of a number of different layers (e.g., at least 4 or 5 total layers; and up to 30 total layers) each layer having one or more different materials and formed above surface 106 and top surface 126 of contact 112. In some cases, layers 107 may include between 6 and 12 layers; each layer having one, two or three different materials. In some embodiments, zone 104 may have layers of only dielectric material, only conductor material, or a combination of dielectric and conductor (e.g., a patterned layer having areas from a top perspective of only dielectric material areas of only conductor material areas, such as shown for FIG. 2). In some embodiments, each of these layers (e.g., each of layers 107) has pitch according to the industry's standards for layers within a die or chip. In some embodiments, each of these layers (e.g., each of layers 107) has pitch 111 or is formed by a chip forming process, recipe or plan of record (POR).

In some first embodiments, each layer of layers 107 is a layer of only dielectric or conductor material (e.g., blanket layers). One example of this is the alternating only dielectric material layers 122 and only conductor material layers 121 of embodiments of FIG. 1. Here, the only dielectric material layers 122 and only conductor material layers 121 may be formed on top of and touching one another in an alternating vertical sequence. It can be appreciated that in some cases, other materials may exist in the only dielectric or conductor material as long as the only dielectric layer does not include conductor material, and the only conductor layer does not include dielectric material.

In some second embodiments, each layer of layers 107 is a layer of only dielectric and conductor. Some embodiments of these layers may be layers that are a combination of dielectric and conductor (e.g., a patterned layer having areas from a top perspective of only dielectric material areas of only conductor materials areas). One example of this is the dielectric and conductive material containing layers 212-220 of embodiments of FIG. 2. Here, each of layers 212, 214, 216, 218 and 220 may be formed on top of and touching the prior layer in the sequence. It can be appreciated that in some cases, other materials may exist in the only dielectric and conductor material as long as it does not include conductor material in the dielectric material, and does not include dielectric material, in the conductor material.

In some third embodiments, layers of each layer of layers 107 is a layer of only dielectric; only conductor; or only dielectric and conductor. One example of this is a combination of (1) the alternating only dielectric material layers 122 and only conductor material layers 121 of embodiments of FIG. 1, with (2) the dielectric and conductive material containing layers 212-220 of embodiments of FIG. 2. Here, any of (a) the only dielectric material layers 122, (b) the only conductor material layers 121, and (c) any of layers 212, 214, 216, 218 and 220 may be formed on top of and touching a prior layer in the vertical sequence.

In some embodiments, layers 107 has a total height (e.g., combined) H5 of "these layers" (e.g., the described for any of the three embodiments above). In some embodiments, total height H5 of layers 107 includes a bottom "passivation" layer (e.g., layer 120), such as formed on surfaces 104 and 126, and upon which "these layers" are formed. This passivation layer may be a solid blanket layer of dielectric material (e.g., as described for layers 122 of only dielectric material). This passivation layer may be formed of a dielectric material and have a height sufficient or designed to electrically (and optionally chemically and physically) isolate "these layers" from the signals in (and optionally material of) surfaces 104 and 126.

In some embodiments, layers 107 has a total height (e.g., combined) H6 of these layers (e.g., see layers (optional 120), 121 and 122), and layers 107 are topped or capped with a "top layer" having height H7 (e.g., see layer 123 or 218). This top layer may be a solid blanket layer of conductor material (e.g., as described for layers 121 of only conductor material, but having height H7). This top layer may be a conductive material and have a height for having solder formed thereon or for having a contact of a chip or die soldered thereto.

According to some embodiments, layers 120, 121, 122 and 123 (optionally) are formed according to a chip forming process, recipe or plan of record (POR), such as for forming reduced pitch 111. This process or POR may include a process as described above for: forming layers 107; forming masks and openings to form features with pitch 111; and refer to processing, a design rule (DR), vias, interconnects, interconnect layers, feature sizes, or pitch to form the features in layer 107 (and optionally resist 119). In some embodiments, each of layers 107 (e.g., each of "these layers" for any of the three embodiments above, each passivation layer, and each top layer) has (1) a pitch according to the industry's standards for layers within a die or chip, (2) pitch 111, or (3) is formed by a chip forming process, recipe or plan of record (POR).

FIG. 1 shows embodiments having reduced pitch layers 107 including: bottom dielectric (e.g., nitride) layer 120; alternating conductor (e.g., copper) layers 121 and dielectric (e.g., nitride) layers 122; and top conductor (e.g., copper) layer 123. Layers 107 may be topped with top conductive layer or pad 123. In some cases, zone 104 has alternating layers of dielectric 122 such as silicon nitride, that are 0.2 micrometers in height; alternating with layers of conductor 121 such as copper, that are 2.0 micrometers in height.

In other cases, each "alternating" layer (e.g., each of layers 121 and 122) includes a pattern of conductor within a pattern of dielectric. In this case, each "alternating" layer is or includes such layers of equal height copper and nitride, patterned in the same layer. In one case, each "alternating" layer may have a 2.0 micrometers height layer of patterned copper formed with a 2.0 micrometers height layer of patterned (e.g., where the copper is not) nitride (e.g., see layers 212-220 of FIG. 2). In some cases, each "alternating" layer is or includes such layers of equal height copper and nitride, patterned in the same layer.

In still other cases, each first one of the "alternating" layers (e.g., see conductor layers 121) includes a pattern of conductor within a pattern of dielectric. In this case, each "alternating" layer 121 may have a 2.0 micrometers height layer of patterned copper formed with a 2.0 micrometers height layer of patterned (e.g., where the copper is not) nitride (e.g., see layers 212-220 FIG. 2). In this case, each second one of the "alternating" layers (e.g., see dielectric layers 122) is a layers of blanket dielectric material such as silicon nitride, that is 0.2 micrometers in height.

Conductor(s) and traces described for layers 121, 122 (e.g., when layer 122 has conductor and dielectric) and 123 (optionally) may each be a height (e.g., thickness) of solid conductive material. Such material may be or include copper, gold, silver, bronze, nickel, silver, aluminum, molybdenum, an alloy, or the like as known for such a contact. In some cases, they are all copper.

These conductors and traces may be a blanket layer that is masked and etched to form the contacts; or may be a layer that is formed within openings in a mask, and the mask then removed (e.g., dissolved or burned) to form the contacts. In some cases, the mask is the dielectric of the layer 121 or 122 (e.g., when layer 122 has conductor and dielectric). In some cases, the dielectric of the layer 121 or 122 (e.g., when layer 122 had conductor and dielectric) is subsequently formed around the conductor and traces of the layer 121 or 122 (e.g., when layer 122 had conductor and dielectric). In some cases, these conductors and traces may be formed by a process known to form pitch 111 and/or a POR for dielectric, masks, patterns, conductors, contacts, vias and traces within a die or chip (e.g., having pitch 111 and/or a chip POR). In some cases, these conductors and traces are formed by chemical vapor deposition (CVD). In some cases they are formed by atomic layer deposition (ALD).

In some cases, the mask may be a material formed on zone 104; and then having a pattern of the mask removed (e.g., dissolved, developed or burned) to form the openings where the conductor material of the traces and contacts are formed. In some cases, the mask may be patterned using photolithography. In some cases, the mask may be liquid photoimageable "wet" mask or a dry film photoimageable "dry" mask blanket layer sprayed onto the package; and then masked and exposed to a pattern of light (e.g., the mask is exposed to light where a template of the pattern placed over the mask does not block the light) and developed to form the openings. Depending on the mask type, the exposed or unexposed areas are removed. In some cases, the mask goes through a thermal cure of some type after the openings (e.g., pattern) are defined. In some cases, the mask may be formed by a process known to form such a mask of a chip, chip pitch device (e.g., having pitch 111), or device formed using a chip POR Dielectric described for layers 121 (e.g., when layer 121 has conductor and dielectric) and 122, may each be a height (e.g., thickness) of solid non-conductive material. Such material may be or include silicon nitride, silicon dioxide, porcelain, glass, plastic, or the like as known for such a dielectric. In some cases it is silicon nitride.

These dielectrics may be a blanket layer that is masked and etched to form openings where the conductor and traces are deposited, grown or formed. Alternatively, these dielectrics may be a layer that is formed on a patterned mask, and the mask then removed (e.g., dissolved or burned) to form openings where the conductor and traces are deposited, grown or formed. In some cases, the dielectric may be formed by a process known to form pitch 111 and/or a POR for dielectric, masks, patterns, conductors, contacts, vias and traces within a die or chip (e.g., having pitch 111 and/or a chip POR). In some cases, the dielectric is formed by atomic layer deposition (ALD). In some cases it is formed by chemical vapor deposition (CVD).

Resist 119, may each be a height (e.g., thickness) H8 of solid non-conductive solder resist material as described for resist 116.

Resist 119 may be a blanket layer that is masked and etched to form openings where solder can be formed on and attached to the upper contacts, or where conductors and traces within a die or chip (e.g., having pitch 111) can be soldered to the top contacts 123. Resist 119 may be formed as described for resist 116, but using a process known for forming resist 119 and openings 118 having pitch 111 and/or a POR for conductors, contacts, vias and traces within a die or chip (e.g., having pitch 111 and/or a chip POR).

In some cases the resist is laser scribed to form the openings. In some cases, the resist may be formed by a process known to form such a resist of a chip or die.

Figure 2A:
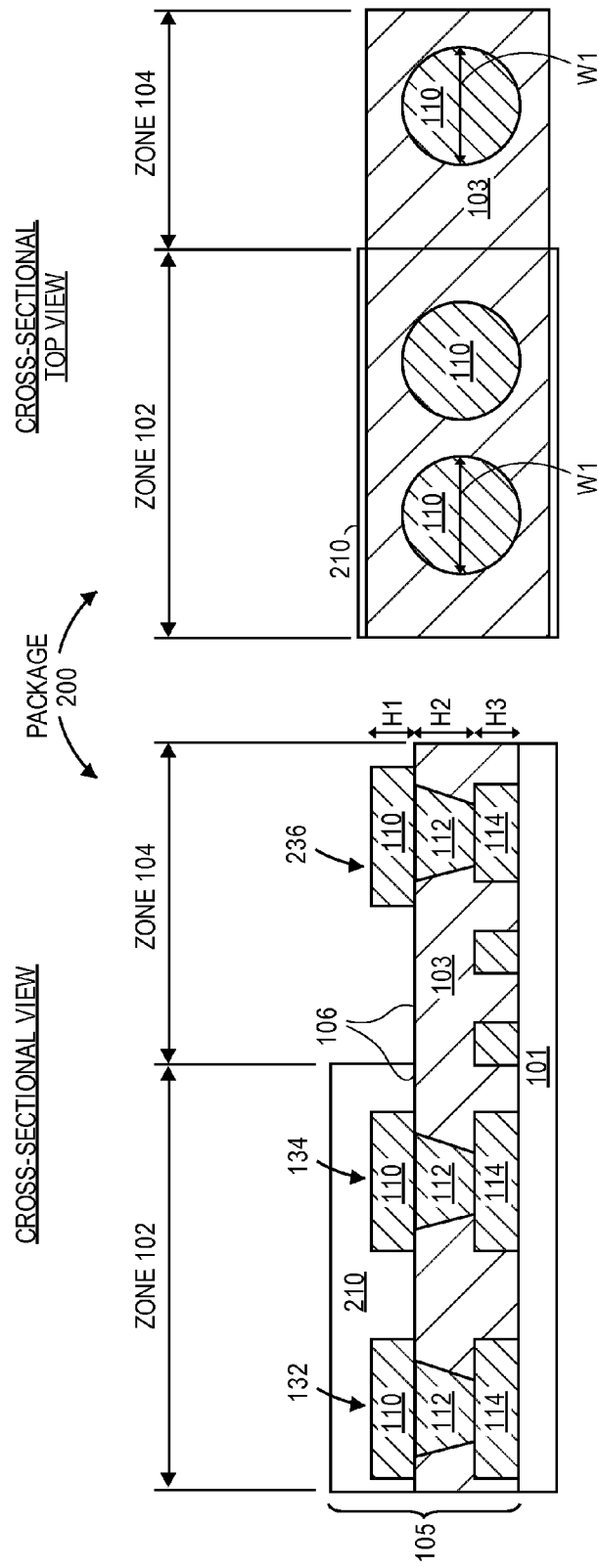
FIG. 2A is a schematic cross-sectional side view and a cross-sectional top perspective view of a semiconductor device package upon which an integrated circuit (IC) chip or "die" may be directly attached.

FIG. 2A is a schematic cross-sectional side view and a cross-sectional top perspective view of a semiconductor device package upon which an integrated circuit (IC) chip or "die" may be directly attached. FIG. 2A shows package 200 having package substrate 101 upon which interconnect layer 105 is formed. Although layer 105 is shown with standard package pitch zone 102 adjacent to reduced pitch zone 104, only standard package pitch features exist in zones 102 and 104 of FIG. 2A because the reduced pitch features have not yet been formed. In some cases, FIG. 2A shows package 200 which may be a package prior to forming an embodiment of package 100 of FIG. 1.

FIG. 2A shows package 200 having interconnects 132 and 134 in zone 102; and interconnect 236 in zone 104. Interconnect 132, 134 and 236 may have only standard package pitch features. FIG. 2A shows mask 210, such as a dry film resist (DFR) mask, formed over zone 102 and leaving zone 104 and contact 110 of interconnect 236 exposed. Mask 210 may protect zone 102 of any etching or removal of contacts 110 in zone 102 during etching to remove contact 110 from interconnect 236 in zone 104. Mask 210 may be a mask as described above for a mask used when forming contacts 110, or dielectric 103.

FIG. 2B shows the package of FIG. 2A after removing a standard package pitch contact from over a via contact in a reduced pitch zone. FIG. 2B shows the substrate of FIG. 2A after removing contact 110 from interconnect 236. Contact 110 of interconnect 236 may be selectively etched for a time to expose the top surface 126 of contact 112. This etch may be selective with respect to dielectric 103 such that it does not etch surface 106, and only removes height, H1, of contact 110 after a predetermined amount of etching time. Thus, in FIG. 2B surfaces 106 and 126 are exposed in zone 104 while mask 210 protects surface 106 and interconnects 132 and 134 in zone 102.

FIG. 2C shows the package of FIG. 2B after forming a first layer of conductive material and dielectric material in a reduced pitch zone. FIG. 2C shows the package of FIG. 2B after forming layer 212 onto (e.g., over and in direct contact with or touching) surfaces 106 and 126 in zone 104. Mask 210 may protect zone 102 from any formation of layer 212 in zone 102 during forming of layer 212 in zone 104. Layer 212 includes or is conductive material contact 221, trace 222, and contact 223; and dielectric material 225. Layer 212, contact 221, trace 222, and contact 223, and dielectric material 225 may all be formed by a process known for forming pitch 111 and/or using a chip POR. They may all have pitch 111.

Contact 223 may be formed onto (e.g., over and in direct contact with or touching) and electrically connected to top surface 126 of contact 112. In some cases, contact 223 is formed within (e.g., smaller in area than and within) the area of surface 126. In other cases, it is formed over and extends beyond the edges of the area of surface 126. In some cases, contact 112 and 223 are designed (e.g., are formed of a material, have a width and height appropriate) for providing a power (e.g., direct current) or ground signal to a chip or die (e.g., attached or soldered to zone 104).

Contact 221 and trace 222 may be formed onto (e.g., over and in direct contact with or touching) or over surface 106, and are not physically or electrically connected to top surface 126 of contact 112. Contact 221 is physically and electrically connected to trace 222, such as by being formed at the same time and of the same material in the same pattern (e.g., masked area). Trace 222 may be physically or electrically connected to another conductive feature of substrate 101. Thus, contact 221 may provide a different electrical signal than contact 223 (e.g., a second signal). In some cases, contact 221 and trace 222 are designed (e.g., are formed of a material, have a width and height appropriate) for providing a data signal (e.g., high and low voltage and current) or memory data signal to a chip or die (e.g., attached or soldered to zone 104).

Dielectric 225 may be formed onto (e.g., over and in direct contact with or touching) or over surface 106 (and optionally part of surface 126), and is not electrically connecting anything since it is a non-conductive dielectric. Dielectric 225 may be the pattern (e.g., mask) for forming conductive material contact 221, trace 222, and contact 223.

Conductive material contact 221, trace 222, and contact 223 may each be a height or thickness of only conductor material. Dielectric 225 may be a height or thickness of only dielectric material.

In some cases, contact 221 has a width of W10 and a height of between 0.2 and 4 µm. In some cases the height is between 1 and 3 µm. In some cases, contact 223 has a width of W11 and a height as noted above for contact 221. In some cases trace 222 has a width of W12 and a height as noted above for contact 221. In some cases, W11 is between 30 and 70 µm. In some cases, it is between 10 and 70 µm. In some cases, it is between 25 and 50 µm. In some cases, it is between 20 and 40 µm. In some cases, W10 of a processor feature pitch 111 small contact is between 5 and 20 µm. In some cases it is equal to or below 15 µm. In some cases, it is between 5 and 10 µm. In some cases it is between 10 and 70 µm. In some cases, W12 or a "trace and space" of a processor feature pitch 111 small trace is between 1 and 5 µm. In some cases it is equal to or below 3 µm. In some cases, it is between 1 and 3 µm. Widths W10, W11 and W12; and the height of contact 221, contact 223, trace 222 and dielectric 225 may have pitch 111 and/or be formed using a chip POR.

In some embodiments, layer 212 may be a layer that is a combination of dielectric and conductor (e.g., a patterned layer having areas from a top perspective of only dielectric material areas (e.g., material 225) and of only conductor materials areas (e.g., material contact 221, trace 222, and contact 223). Layer 212 may be formed as described above for forming layer 121 or 122 if that layer includes dielectric and conductor material (e.g., one of the "alternating" layers that includes a pattern of conductor within a pattern of dielectric). In some cases, contact 221, trace 222 and contact 223 may be formed as described above for forming conductor of layers 121 or 122 if, layer 122 has conductor and dielectric. In some cases, dielectric 225 may be formed of a material and using a process as described above for forming dielectric of layers 122, or 121, if layer 121 has conductor and dielectric material.

FIG. 2D shows the package of FIG. 2C after forming a second layer of conductive material and dielectric material in a reduced pitch zone. FIG. 2D shows the package of FIG. 2C after forming layer 214 onto (e.g., over and in direct contact with or touching) layer 212 in zone 104. Mask 210 may protect zone 102 from any formation of layer 214 in zone 102 during forming of layer 214 in zone 104. Layer 214 includes or is conductive material contact 231 and contact 233; and dielectric material 235. Layer 214, contact 241, contact 233, and dielectric material 235 may all be formed by a process known for forming pitch 111 and/or using a chip POR. In some cases, they may all have pitch 111.

Contacts 231 and 233 may be formed onto (e.g., over and in direct contact with or touching) and electrically connected to a top surface of contacts 221 and 223, respectively. In some cases, contacts 231 and 233 are formed within or extend beyond the edges of the area of contacts 221 and 223, respectively, as describe for contact 223 formed over surface 126. In some cases, contact 231 is designed for providing a data signal or memory data signal similar to contact 221. In some cases, contact 233 is designed for providing a power signal similar to contact 223.

Dielectric 235 may be formed onto (e.g., over and in direct contact with or touching) or over a top surface of dielectric 225 and trace 222, and is not electrically connecting anything since it is a non-conductive dielectric. Dielectric 235 may be the pattern (e.g., mask) for forming conductive material contact 231 and contact 233.

Conductive material contact 231 and contact 233 may each be a height or thickness of only conductor material. Dielectric 235 may be a height or thickness of only dielectric material.

In some cases, contact 231 has a width of W10 and a height as noted above for contact 221. In some cases, contact 233 has a width of W11 and a height as noted above for contact 221. Widths W10 and W11; and the height of contact 231, contact 223 and dielectric 235 may have pitch 111 and/or be formed using a chip POR. In some embodiments, layer 214 may be a layer that is a combination of dielectric and conductor as described for layer 212.

FIG. 2E shows the substrate of FIG. 2D after forming a third layer of conductive material and dielectric material in a reduced pitch zone. FIG. 2E shows the substrate of FIG. 2D after forming layer 216 onto (e.g., over and in direct contact with or touching) layer 214 in zone 104. Mask 210 may protect zone 102 from any formation of layer 216 in zone 102 during forming of layer 216 in zone 104. Layer 216 includes or is conductive material contact 241, contact 243, trace 242 and contact 244; and dielectric material 245. Layer 216, contact 241, contact 243, trace 242 and contact 244; and dielectric material 245 may all be formed by a process known for forming pitch 111 and/or using a chip POR. They may all have pitch 111.

Contacts 241 and 243 may be formed onto (e.g., over and in direct contact with or touching) and electrically connected to a top surface of contacts 231 and 243, respectively. In some cases, contacts 241 and 243 are formed within or extend beyond the edges of the area of contacts 231 and 233, respectively, as describe for contact 223 formed over surface 126. In some cases, contact 241 is designed for providing a data signal or memory data signal similar to contact 221. In some cases, contact 243 is designed for providing a power signal similar to contact 223.

Contact 244 and trace 242 may be formed onto (e.g., over and in direct contact with or touching) or over a top surface of dielectric layer 235, and are not physically or electrically connected to a top surface of contact 231 or 233. Contact 244 is physically and electrically connected to trace 242, such as by being formed at the same time and of the same material in the same pattern (e.g., masked area). Trace 242 may be physically or electrically connected to another conductive feature of substrate 101. Thus, contact 244 may provide a different electrical signal than contact 241 or 243 (e.g., a third signal). In some cases, contact 244 and trace 242 are designed for providing a data signal or memory data signal similar to contact 221.

Dielectric 245 may be formed onto (e.g., over and in direct contact with or touching) or over a top surface of dielectric 235, and is not electrically connecting anything since it is a non-conductive dielectric. Dielectric 245 may be the pattern (e.g., mask) for forming conductive material contact 241, contact 243, trace 242 and contact 244.

Conductive material contact 241, contact 243, trace 242 and contact 244 may each be a height or thickness of only conductor material. Dielectric 245 may be a height or thickness of only dielectric material.

In some cases, contacts 241 and 244 have a width of W10 and a height as noted above for contact 221. In some cases, contact 243 has a width of W11 and a height as noted above for contact 221. In some cases trace 242 has a width of W12 and height as noted above for contact 221. Widths W10, W11 and W12; and the height of contact 241, contact 243, trace 242 contact 244, and dielectric 245 may have pitch 111 and/or be formed using a chip POR. In some embodiments, layer 216 may be a layer that is a combination of dielectric and conductor as described for layer 212.

According to embodiments, various additional layers, similar to layer 212, 214 or 216 may be formed over layer 216. Also, in some cases, layers similar to layers 120, 121, 122 or 123 may be formed below or over layers 212, 214, 216, or layers formed over layer 216.

Figure 2F:
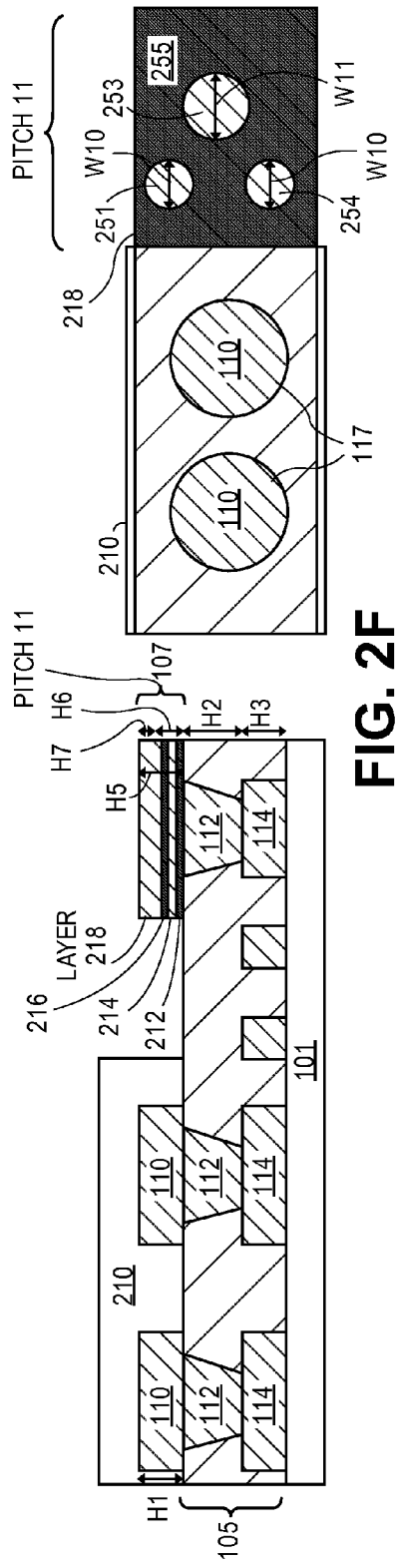
FIG. 2F shows the substrate of FIG. 2E after forming a final layer of conductive material and dielectric material in a reduced pitch zone.

FIG. 2F shows the substrate of FIG. 2E after forming a final layer of conductive material and dielectric material in a reduced pitch zone. FIG. 2F shows the substrate of FIG. 2E after forming layer 218 onto (e.g., over and in direct contact with or touching) layer 216 (or a layer over layer 216 as noted above) in zone 104. Mask 210 may protect zone 102 from any formation of layer 218 in zone 102 during forming of layer 218 in zone 104. Layer 218 includes or is conductive material contact 251, contact 253, and contact 254; and dielectric material 255. Layer 218, contact 251, contact 253 and contact 254; and dielectric material 255 may all be formed by a process known for forming pitch 111 and/or using a chip POR. They may all have pitch 111.

Contacts 251, 253 and 254 may be formed onto (e.g., over and in direct contact with or touching) and electrically connected to a top surface of contacts 241, 243 and 244, respectively. In some cases, contacts 251, 253 and 254 are formed within or extend beyond the edges of the area of contacts 241, 243 and 244, respectively, as describe for contact 223 formed over surface 126. In some cases, contacts 251 and 254 are designed for providing a data signal or memory data signal similar to contact 221. In some cases, contact 253 is designed for providing a power signal similar to contact 223.

Dielectric 255 may be formed onto (e.g., over and in direct contact with or touching) or over a top surface of dielectric 245 and trace 242, and is not electrically connecting anything since it is a non-conductive dielectric. Dielectric 255 may be the pattern (e.g., mask) for forming conductive material contact 251, contact 253 and contact 254.

Conductive material contact 251, contact 253 and contact 254 may each be a height or thickness of only conductor material. Dielectric 255 may be a height or thickness of only dielectric material.

In some cases, contacts 251 and 254 have a width of W10 and a height as noted above for contact 221. In some cases, contact 253 has a width of W11 and a height as noted above for contact 221. Widths W10 and W11; and the height of contact 251, contact 253 contact 254, and dielectric 255 may have pitch 111 and/or be formed using a chip POR. In some embodiments, layer 218 may be a layer that is a combination of dielectric and conductor as described for layer 212.

In some embodiments, layers 212-216 form part of layers 107 and have a total height (e.g., combined) H6; and layer 218 also forms part of layers 107 and is "top layer" having height H7 (e.g., see FIG. 1). Contacts 251, 253 and 254 layer 218 may be a conductive material and have a height for having solder formed thereon or for having a contact of a chip or die soldered thereto.

FIGS. 2A-2F shows embodiments having reduced pitch layers 107 including: layers 212-218. Layers 107 may be topped with top conductive layer or pad 218. In some cases, zone 104 has layers 212-216 of patterned dielectric such as silicon nitride and patterned conductor such as copper, that are each 2.0 micrometers in height.

Figure 2G:
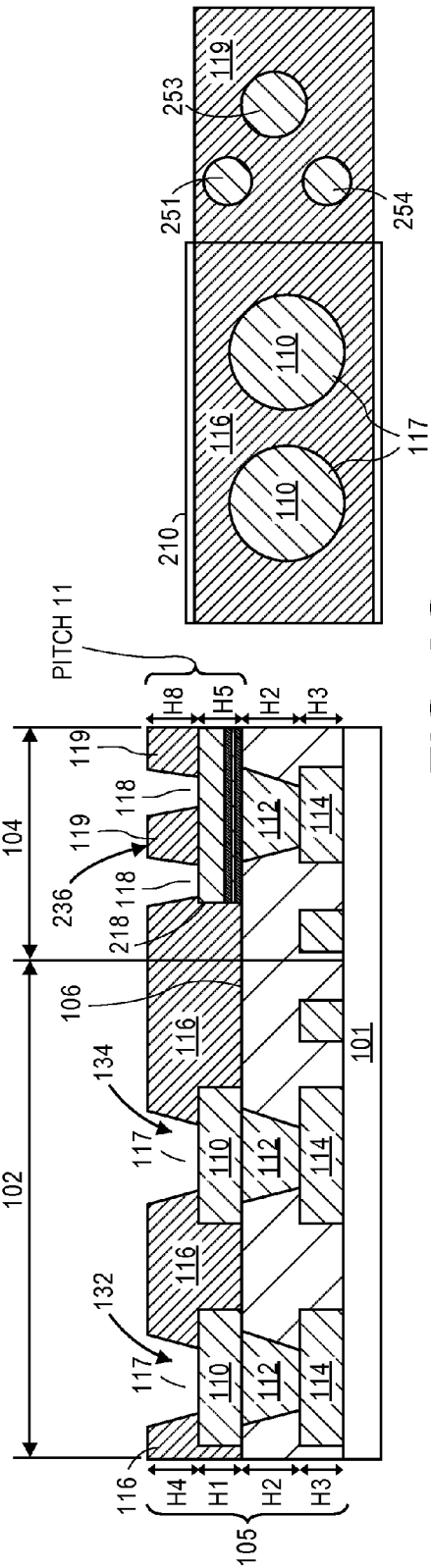
FIG. 2G shows the package of FIG. 2F after forming a solder resist layer over a final layer of conductive material and dielectric material in a standard package pitch zone and a reduced pitch zone.

FIG. 2G shows the package of FIG. 2F after forming a solder resist layer over a final layer of conductive material and dielectric material in a standard package pitch zone and a reduced pitch zone. FIG. 2G shows the package of FIG. 2F after forming resist 116 onto (e.g., over and in direct contact with or touching) contacts 110 and surface 106 in zone 102; and resist 119 onto dielectric 255 in zone 104. Mask 210 is removed prior to forming resist 116 (and 119). Resists 116 and 119 have openings 117 and 118, respectively.

Solder resist 116 may have height (e.g., thickness), H4, above the top surface of contacts 110 interconnects 132 and 134. Solder resist 116 may have a total height over surface 106 that is H1+H4. Openings 117 are shown formed through solder resist 116 above and exposing a top surface of contacts 110 of interconnects 132 and 134. Openings 117 may have a lower width of W5 and an upper width of W6 (See FIG. 1).

Solder resist 119 is shown formed over a top surface of layers 107. Solder resist 119 may have height (e.g., thickness), H8, above the top surface of layer 218. Openings 118 are shown formed through solder resist 119 (and the side of resist 116) above and exposing a top surface of contacts 251, 253 and 254 of interconnect 136 (e.g., of layers 107). Openings 118 may have a lower width of W8 and an upper width of W9. In FIG. 2, width W8 may be width W10 over or at contacts 251 and 254; and may be width W11 over or at contact 253.

Resists 116 and 119; and openings 117 and 118 may be formed at the same time or during the same processing processes. In some cases, resist 116, resist 119, openings 117 and openings 118 may all be formed by a process known for forming pitch 111 and/or using a chip POR; however, resist 116 and openings 117 may be formed with pitch 109 while resist 119 and openings 118 are formed with pitch 111.

Figure 3A:
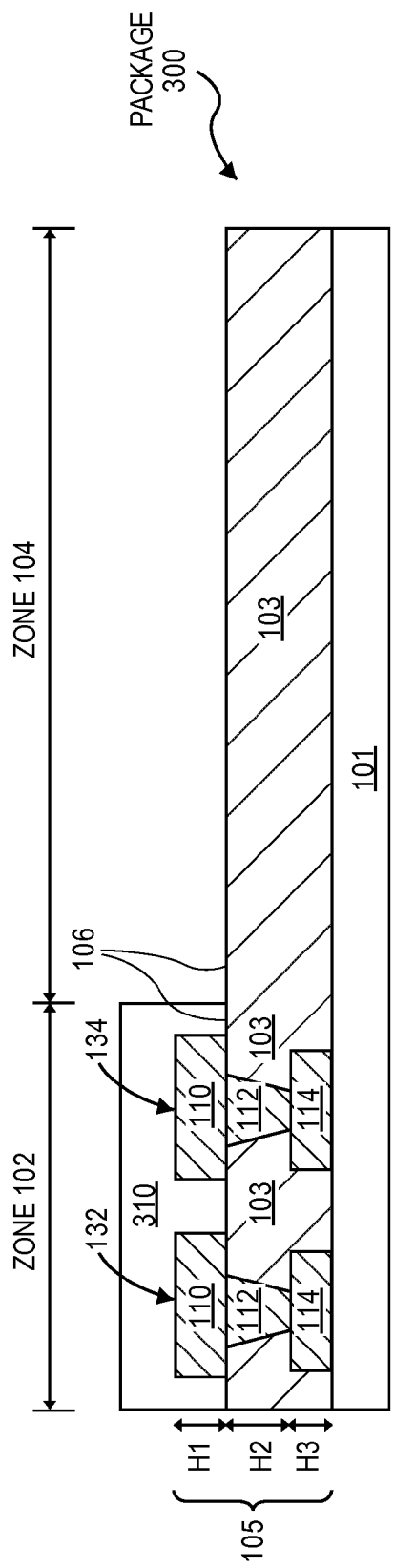
FIG. 3A is a schematic cross-sectional side view of a semiconductor device package upon which an integrated circuit (IC) chip or "die" may be directly attached.

FIG. 3A is a schematic cross-sectional side view of a semiconductor device package upon which an integrated circuit (IC) chip or "die" may be directly attached. FIG. 3A shows package 300 having package substrate 101 upon which interconnect layer 105 is formed. Although layer 105 is shown with standard package pitch zone 102 adjacent to reduced pitch zone 104, only standard package pitch features exist in zones 102 and 104 of FIG. 3A because the reduced pitch features have not yet been formed. In some cases, FIG. 3A shows package 300 which may be a package prior to forming an embodiment of package 100 of FIG. 1.

FIG. 3A shows package 300 having interconnects 132 and 134 in zone 102; and no interconnects in zone 104. In alternate embodiments, there may be interconnects in zone 104, but those interconnects do not extend or have conductive material above surface 106. Interconnects 132 and 134 may have only standard package pitch features (as will any features in zone 104 at this point in time). FIG. 3A shows mask 310, such as a described or mask 210, formed over zone 102 and leaving zone 104 exposed.

FIG. 3B shows the package of FIG. 3A after forming layer 320 onto (e.g., over and in direct contact with or touching) surface 106 in zone 104. Mask 310 may protect zone 102 from any formation of layer 320 in zone 102 during formation of layer 320 in zone 104. In some cases, layer 320 includes or is dielectric material, and has a height (e.g., is a passivation layer) as described for layer 120. Layer 320 may be formed by a process known for forming pitch 111 and/or using a chip POR. Layer 320 may have pitch 111.

In some cases, layer 320 is formed of the same material, by the same process, and having the same height as layer 120. In some cases, layer 320 is the same as layer 120 except that it extends across all of zone 104. Layer 320 has width W14. In some cases, width W14 is between 1 millimeter (mm) and 20 mm. In some cases, width W14 can actually span an entire width of a die or chip. In some cases, width W14 is the same as width W7 of layer 120. In some cases, width W14 is the greater than width W7 such as by being 2, 3 or 4 times greater.

Layer 320 may be formed onto (e.g., over and in direct contact with or touching) or over surface 106, and is not electrically connecting anything since it is a non-conductive dielectric. Layer 320 may be a height or thickness of only dielectric material.

In some embodiments, layer 320 may be formed as described above for forming layer 120 or 225 of only dielectric material.

FIG. 3C shows the package of FIG. 3B after forming alternating layers of conductive material and dielectric material in a reduced pitch zone. FIG. 3C shows the package of FIG. 3B after forming reduced pitch layers 307 having conductive layers 321 and dielectric layers 322 onto (e.g., over and in direct contact with or touching) layer 320 in zone 104. Mask 310 may protect zone 102 from any formation of layers 321 and 322 in zone 102 during forming of layers 321 and 322 in zone 104. Layers 321 and 322 may be formed by a process known for forming pitch 111 and/or using a chip POR. In some cases, layers 321 and 322 may have pitch 111.

Reduced pitch layers 307 of FIG. 3C may include layers 320, 321 and 322; have pitch 111; and may have height, H5 (e.g., above surface 106). Height H5 may be a total thickness of a number of different layers (e.g., at least 4 or 5 total layers; and up to 30 total layers) each layer having one or more different materials and formed above surface 106. In some cases, layers 307 may include between 6 and 12 layers; each layer having one, two or three different materials. In some embodiments, each layer of layers 307 is only dielectric material, only conductor material, or a combination of dielectric and conductor (e.g., a patterned layer having areas from a top perspective of only dielectric material areas of only conductor material areas, such as shown for FIG. 2).

In some cases, layers 321 and 322 are formed between masks 312. In some cases, layers 321 and 322 form interconnects 336, 337, 338 and 339 above layer 320. Layers 321 and 322 of interconnect 336 are formed between mask 312 and 313. Layers 321 and 322 of interconnect 337 are formed between mask 313 and 314. Layers 321 and 322 of interconnect 338 are formed between mask 314 and 315. Layers 321 and 322 of interconnect 339 are formed between mask 315 and 312. Masks 312, 313, 314 and 315 may be a mask as described for mask 210, a mask to pattern contact 221, or dielectric 225.

In some cases, masks 312 have a width in zone 104 sufficient to electronically isolate stacks 336-339 from adjacent electronic features, such as those in zone 102. In some cases, masks 313-315 each have width W16 in zone 104 sufficient to electronically isolate each of stacks 336-339 from an adjacent stack of stacks 336-339 in zone 104. In some cases, width W16 or a "trace and space" of a processor feature pitch 111 small trace mask is between 3 and 8 μm. In some cases it is equal to or below 3 μm. In some cases, it is between 3 and 5 μm.

In some cases, layers 321 and 322 are formed of the same material, by the same process, and having the same height as described for layers 121 and 122, respectively. In some cases, layers 321 and 322 are the same as layers 121 and 122 except that they have width W15 in zone 104. In some cases, width W15 or a "trace and space" of a processor feature pitch 111 small trace is between 1 and 5 μm. In some cases it is equal to or below 3 μm. In some cases, it is between 1 and 3 μm. In some cases, width W15 is the same as width W7 of layer 121 and 122. In some cases, width W14 is the smaller width W7 such as by being 2, 3 or 4 times smaller. In some cases, width W15 is the same as width W10 or W11. In some cases, width W15 is the same as width W12 of trace 222. In some case, layers 321 may be or include conductive traces. In some case, layers 321 are or include traces as described for trace 222. In some case, layers 321 are or include fine interconnects on the front side of package 300.

A first, lowest one of layers 321 may be formed onto (e.g., over and in direct contact with or touching) a top surface of layer 320 of dielectric. Each of layers 322 may be formed onto (e.g., over and in direct contact with or touching) or over a top surface of one of layers 321, and are not electrically connecting anything since each is a non-conductive dielectric. Each of layers 321, above the lowest one of layers 321 may be formed onto (e.g., over and in direct contact with or touching) or over a top surface of one of layers 322.

In some first embodiments, layers 321 may each be a height or thickness of only conductor material; and layers 322 may each be a height or thickness of only dielectric material. Here, the only dielectric material layers 322 and only conductor material layers 321 may be formed on top of and touching one another in an alternating vertical sequence. It can be appreciated that in some cases, other (e.g., third) materials may exist in the only dielectric or conductor material as long as the only dielectric layer does not include conductor material, and the only conductor layer does not include dielectric material. In these case, layers 321 may be conductive traces, such as traces as described for trace 222. In these cases, layers 321 may be conductive contacts such as described for contact 221 or 223. In some case, layers 321 may be fine interconnects on the front side of package 300 (e.g., such as contact 221 or 223, topped with contact 251 or 253).

In some second embodiments, layers 321 may each be a height or thickness of only dielectric and conductor material; and layers 322 may each be a height or thickness of only dielectric material. Some embodiments of these layers 321 may be layers that are a combination of dielectric and conductor (e.g., a patterned layer having areas from a top perspective of only dielectric material areas of only conductor materials areas). Here, the only dielectric material layers 322; and only conductor and dielectric material layers 321 may be formed on top of and touching one another in an alternating vertical sequence. One example of this is the dielectric and conductive material containing layers 212-220 of embodiments of FIG. 2. Another example, is where layers 321 are a combination of dielectric and conductor, where the conductor forms signal traces horizontally within or along layer 321 (e.g., a patterned layer having areas from a top perspective of only dielectric material areas and of only conductor materials traces). In these cases, layers 321 include (e.g., within a pattern of dielectric of each layer) a pattern of conductive traces such as described for trace 222. In some case, layers 321 are fine interconnects on the front side of package 300.

In some cases, layers 321, conductive contacts of layers 321 or traces of layers 321 may be physically or electrically connected to a conductive feature of substrate 101. In some cases, each of layers 321, conductive contacts of layers 321 or traces of layers 321 may be physically or electrically connected to a different (e.g., than any other of layers 321, conductive contacts of layers 321 or traces of layers 321) conductive feature of substrate 101. In some cases, layers 321, conductive contacts of layers 321 or traces of layers 321 of each of interconnects 336-339 may be physically or electrically connected to a different (e.g., than any other of layers 321, conductive contacts of layers 321 or traces of layers 321) conductive feature of substrate 101. Thus, each of layers 321, conductive contacts of layers 321 or traces of layers 321 may provide different electrical signal than any other of layers 321, conductive contacts of layers 321 or traces of layers 321. In some cases, only two or three of layers 321 physically or electrically connected to a different conductive feature of substrate 101.

In some cases, layers 321, conductive contacts of layers 321 or traces of layers 321 are designed (e.g., are formed of a material, have a width and height appropriate) for providing a data signal (e.g., high and low voltage and current) or memory data signal to a chip or die (e.g., attached or soldered to zone 104). In some cases, layers 321, conductive contacts of layers 321 or traces of layers 321 are designed (e.g., are formed of a material, have a width and height appropriate) for providing a power (e.g., direct current) or ground signal to a chip or die (e.g., attached or soldered to zone 104).

In some cases, the topmost of each of interconnects 336-339 is a final layer of conductive material such as layer 123 or layer 218 formed onto (e.g., over and in direct contact with or touching) a topmost one of layers 321 in zone 104.

In some cases, each of interconnects 336-339 (and a top layer thereof, if present); layers 321, conductive contacts of layers 321 or traces of layers 321; and masks 312, 313, 314 and 315 may have pitch 111 and/or be formed using a chip POR.

FIG. 3D shows the package of FIG. 3C after forming a solder resist layer over a final layer of conductive material (and optionally dielectric material) in a standard package pitch zone and a reduced pitch zone. FIG. 3D shows the package of FIG. 3C after forming resist 116 onto (e.g., over and in direct contact with or touching) contacts 110 (e.g., upon side surfaces and partially covering a top surface of contacts 110) and surface 106 in zone 102; and resist 119 onto interconnects 336-339 (e.g., upon side surfaces and partially covering a top surface of interconnects 336-339) and a top surface of dielectric 320 in zone 104. Masks 310, and 312-315 are removed prior to forming resists 116 (and 119). Resists 116 and 119 have openings 117 and 118, respectively. Solder resist 116, resist 119, openings 117 and openings 118 may be as described for FIG. 1 or 2G.

Solder resist 119 may have height (e.g., thickness), H8, above and may expose the top surface of interconnects 336-339. Openings 118 may have a lower width of W8 and an upper width of W9. In some cases, in FIG. 3C, width W8 may be the same as width W10 over or at contacts 251 and 254; or may be the same as width W11 over or at contact 253.

Resists 116 and 119; and openings 117 and 118 may be formed at the same time or during the same processing processes. In some cases, resist 116, resist 119, openings 117 and openings 118 may all be formed by a process known for forming pitch 111 and/or using a chip POR; however, resist 116 and openings 117 may be formed with pitch 109 while resist 119 and openings 118 are formed with pitch 111.

FIG. 3E shows the package of FIG. 3D after forming solder in openings in a solder resist layer over a final layer of conductive material (and optionally dielectric material) in a standard package pitch zone and a reduced pitch zone. FIG. 3E shows the package of FIG. 3D after forming solder 340 in openings 117 onto (e.g., over and in direct contact with or touching) a top surface of contacts 110 in zone 102; and forming solder 342 in openings 118 onto (e.g., over and in direct contact with or touching) a top surface of interconnects 336-339 in zone 104. Resists 116 and 119 may function as masks for forming solder 340 and 342, respectively.

Solder 340 may have pitch 109 or be formed according to a package POR. Solder 342 may have pitch 111 or be formed according to a chip POR. Solder 342 may be solder formed on and attached to the upper contacts of interconnects 336-339; or where conductors and traces within a die or chip (e.g., having pitch 111) can be soldered to the top contacts of interconnects 336-339. Resist 119 may be formed as described for resist 119 of FIG. 1 or 2G.

In some cases, FIGS. 3A-E describe a schematic process flow to enable the fine interconnects on the front side (e.g., top) of the substrate package 300.

Figure 4A:
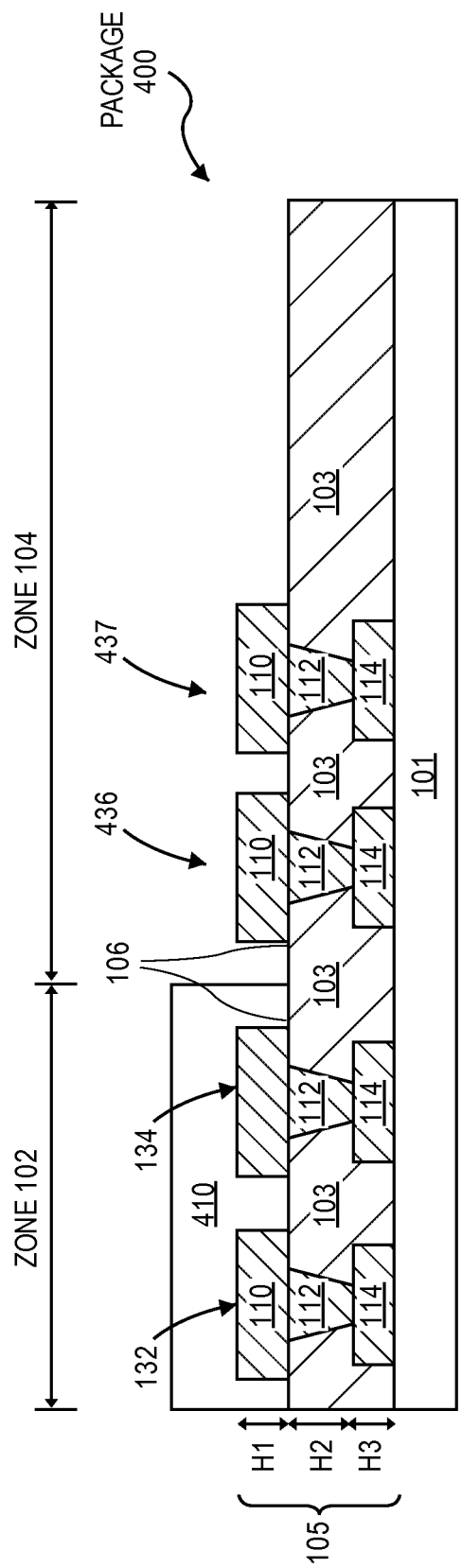
FIG. 4A is a schematic cross-sectional side view of a semiconductor device package upon which an integrated circuit (IC) chip or "die" may be directly attached.

FIG. 4A is a schematic cross-sectional side view of a semiconductor device package upon which an integrated circuit (IC) chip or "die" may be directly attached. FIG. 4A shows package 400 having package substrate 101 upon which interconnect layer 105 is formed. Although layer 105 is shown with standard package pitch zone 102 adjacent to reduced pitch zone 104, only standard package pitch features exist in zones 102 and 104 of FIG. 4A because the reduced pitch features have not yet been formed. In some cases, FIG. 4A shows package 400 which may be a package prior to forming an embodiment of package 100 of FIG. 1.

FIG. 4A shows package 400 having interconnects 132 and 134 in zone 102; and interconnects 436 and 437 in zone 104. Interconnects 132, 134, 436 and 437 may have only standard package pitch features. FIG. 4A shows mask 410, such as a described for mask 210, formed over zone 102 and leaving zone 104 and contacts 110 of interconnect 436 and 437 exposed. Mask 410 may protect zone 102 of any etching or removal of contacts 110 in zone 102 during etching to remove contacts 110 from interconnects 436 and 437 in zone 104. Mask 410 may be a mask as described above for mask 210, formed over zone 102 and leaving zone 104 exposed.

FIG. 4B shows the package of FIG. 4A after removing a height but not all of a standard package pitch contact from over via contacts in a reduced pitch zone. FIG. 4B shows the substrate of FIG. 4A after removing height but not all of contacts 110 from interconnects 436 and 437 in zone 104. A height but not all of contacts 110 of interconnects 436 and 437 may be selectively etched for a time to allow top surface 426 of contacts 110 and height H9 of side surfaces 427 of contacts 110 to exist above top surface 106. In some cases, H9 is between 2 and 7 μm. In some cases, it is between 3 and 6 μm. This etch may be selective with respect to dielectric 103 such that it does not etch surface 106, and only removes height, H1-H9, of contacts 110 after a predetermined amount of etching time while mask 410 protects surface 106 and interconnects 132 and 134 in zone 102. Thus, in FIG. 4B contacts 110 of interconnects 436 and 437 are etched in zone 104 to form contacts 412 having exposed top surfaces 426, and height H9 of side surfaces 427.

FIG. 4C shows the package of FIG. 4B after forming a first layer of dielectric material in a reduced pitch zone. FIG. 4C shows the package of FIG. 4B after forming layer 420 onto (e.g., over and in direct contact with or touching) surfaces 106, 426 and 427 in zone 104. Mask 410 may protect zone 102 from any formation of layer 420 in zone 102 during formation of layer 420 in zone 104. In some cases, layer 420 includes or is dielectric material and has a height (e.g., is a passivation layer) as described for layer 320, except it is a blanket layer also formed on surfaces 426 and 427 in zone 104. Layer 420 may be formed by a process known for forming pitch 111 and/or using a chip POR. Layer 420 may have pitch 111.

In some cases, layer 420 is formed of the same material, by the same process, and having the same height as layer 120. In some cases, layer 420 is the same as layer 120 except that it extends across all of zone 104. Layer 420 has width W14.

Layer 420 may be formed onto (e.g., over and in direct contact with or touching) or over surfaces 106, 426 and 427; and is not electrically connecting anything since it is a non-conductive dielectric. Layer 320 may be a height or thickness of only dielectric material.

In some embodiments, layer 420 may be formed as described above for forming layer 120 or 225 of only dielectric material. In some embodiments, layer 420 (and optionally 421) is a high K dielectric material and has a height (e.g., vertical thickness) such as known for forming a dielectric layer of a capacitor.

FIG. 4D shows the package of FIG. 4C after forming alternating layers of conductive material and dielectric material in a reduced pitch zone. FIG. 4D shows the package of FIG. 4C after forming reduced pitch layers 407 having conductive layers 421 and dielectric layers 422 onto (e.g., over and in direct contact with or touching) layer 420 in zone 104. Mask 410 may protect zone 102 from any formation of layers 421 and 422 in zone 102 during forming of layers 421 and 422 in zone 104. Layers 421 and 422 may be formed by a process known for forming pitch 111 and/or using a chip POR. In some cases, layers 421 and 422 may have pitch 111.

Reduced pitch layers 407 of FIG. 4D may include layers 412, 421 and 422; have pitch 111; and may have height, H5 (e.g., above surface 106). Height H5 may be a total thickness of a number of different layers (e.g., at least 4 or 5 total layers; and up to 30 total layers) each layer having one or more different materials and formed above surface 106. In some cases, layers 407 may include between 6 and 12 layers; each layer having one, two or three different materials. In some embodiments, each layer of layers 407 is only dielectric material, only conductor material, or a combination of dielectric and conductor (e.g., a patterned layer having areas from a top perspective of only dielectric material areas of only conductor material areas, such as shown for FIG. 2).

In some cases, layers 421 and 422 are formed between masks 312. In some cases, layers 421 and 422 form capacitor stacks 436 and 437 and interconnects 438 and 439 above layer 420. Layers 421 and 422 of capacitor stack 436 are formed between mask 312 and 313. Layers 421 and 422 of capacitor stack 437 are formed between mask 313 and 314. Layers 321 and 322 of interconnect 438 are formed between mask 314 and 315. Layers 321 and 322 of interconnect 439 are formed between mask 315 and 312. Masks 312, 313, 314 and 315 may be masks as described for mask 210, a mask to pattern contact 221, or dielectric 225.

In some cases, masks 312 have a width in zone 104 sufficient to electronically isolate stacks 436-437 and interconnects 438-439 from adjacent electronic features, such as those in zone 102. In some cases, masks 313-315 each have width W16 in zone 104 sufficient to electronically isolate each of stacks 436-437 and interconnects 438-439 from an adjacent one of stacks 436-437 and interconnects 438-439 from in zone 104.

In some cases, layers 421 and 422 are formed of the same material, by the same process, and having the same height as described for layers 121 and 122, respectively. In some cases, layers 421 and 422 are the same as layers 121 and 122 except that stacks 436-437 have width W17 and interconnects 438-439 have width W15 in zone 104.

In some cases, width W17 is between 10 and 100 micrometers. In some cases, it is between 10 μm and 1 mm. In some cases, width W17 is the same as width W7 of layer 121 and 122. In some cases, width W17 is the smaller width W7 such as by being 2, 3 or 4 times smaller. In some cases, width W17 is the same as width W10 or W11. In some cases, width W17 is the same as width W12 of trace 222.

A first, lowest one of layers 421 may be formed onto (e.g., over and in direct contact with or touching) a top surface of layer 420 of dielectric. Each of layers 422 may be formed onto (e.g., over and in direct contact with or touching) or over a top surface of one of layers 421, and are not electrically connecting anything since each is a non-conductive dielectric. Each of layers 421, above the lowest one of layers 421 may be formed onto (e.g., over and in direct contact with or touching) or over a top surface of one of layers 422.

In some cases, the topmost of each of stacks 436-437 and interconnects 438-439 is a final layer of conductive material such as layer 123, 218 or the topmost layer of interconnect 336 formed onto (e.g., over and in direct contact with or touching) a topmost one of layers 421 in zone 104.

In some first embodiments, layers 421 may each be a height or thickness of only conductor material; and layers 422 may each be a height or thickness of only dielectric material as described for layers 321 and 322, respectively. In some second embodiments, layers 421 may each be a height or thickness of only dielectric and conductor material; and layers 422 may each be a height or thickness of only dielectric material as described for layers 321 and 322, respectively. In some cases, layers 421, conductive contacts of layers 421 or traces of layers 421 may be physically or electrically connected to a conductive feature of substrate 101 as described for layers 321. In some cases, layers 421, conductive contacts of layers 421 or traces of layers 421 are designed for providing a data signal, a memory data signal, or a power signal as described for layers 321.

In some cases, each of stacks 436-437 and interconnects 438-439 (and a top layer thereof, if present); layers 421, conductive contacts of layers 421 or traces of layers 421 may have pitch 111 and/or be formed using a chip POR.

In some case, interconnects 438-439 are the same as interconnects 338-339. In some case, interconnects 438-439 are the same as interconnects 338-339, except that interconnects 438-439 have one fewer of layers 431 and 432 (e.g., one fewer of layers 331 and 332) than interconnects 338-339.

In some case, capacitor stacks 436-437 are the same as interconnects 338-339, except that layer 422 is a capacitor dielectric and layers 421 are capacitor electrodes. In these case, layer 422 and layers 421 have a height and are a material to form stacks 436-437 that are a decoupling capacitor, a multi-layer-ceramic-capacitor (MLCC), a capacitor formed within a package, or capacitor formed within a die or chip. In these cases, layer 422 may be a capacitor dielectric material such as a class 2 ceramic material, BaTiO3, an X5R class dielectric, a X7R class dielectric, or Titanium dioxide (TiO2), modified by additives of Zinc, Zirconium, Niobium, Magnesium, Tantalum, Cobalt or Strontium. In some embodiments, it may be a mixture thereof. In these cases, layers 421 may be a capacitor electrode material such as a conductor, a metal, an alloy or a conductor as described for contact 110. In some embodiments, it may be a mixture thereof. In these cases, layer 422 and layers 421 may have a thickness and width to create a capacitance of between 0.1 pico-Farad and 4.7 micro-Farad. In these cases, the layer 422 and layers 421 may provide a capacitance of several hundred pico-farad per mm$^2$ of area from the top perspective (e.g., per mm of W17×length). In these cases, the layer 422 and layers 421 may have a total or combined height (e.g., the aggregate of the two plates plus the dielectric) of between 3 and 6 μm. In some cases it may be 4.2 μm.

In some cases, bottom layer of layers 421 may be electrically coupled to ground, such as by layer 420 being a layer like layer 212 and having contact 223 attaching the bottom layer 421 to layer 412 which is grounded through interconnects 112 and 114 below contact 223 (e.g., see FIG. 2C). In some cases, top layer of layers 421 may be or include a signal trace, such as by the top layer being a layer like layer 321 (e.g., being or having a trace like trace 222) or 212 (e.g., having trace 222) (e.g., see FIG. 3C or 2C). In some cases, top layer of layers 421 may be electrically coupled to a power signal, such as by the top layer being a layer like layer 218 (e.g., being or having a contact like contact 253 which is electrically connected through contacts 243, 233 and 223 to interconnect contact 112 which is connected to a positive voltage power signal, such as through contact 114) (e.g., see FIG. 2F).

In some cases, top layer of layers 421 may be electrically coupled to ground, such as by the top layer being a layer like layer 218 (e.g., being or having a contact like contact 253 which is electrically connected through contacts 243, 233 and 223 to interconnect contact 112 which is connected to ground, such as through contact 114) (e.g., see FIG. 2F). In some cases, bottom layer of layers 421 may be or include a signal trace, such as by the bottom layer being a layer like layer 321 (e.g., being or having a trace like trace 222) or 212 (e.g., having trace 222) (e.g., see FIG. 3C or 2C). In some cases, bottom layer of layers 421 may be electrically coupled to a power signal, such as by the bottom layer being a layer like layer 212 and having contact 223 attaching the bottom layer 421 to layer 412 which provides a positive voltage power signal through interconnects 112 and 114 below contact 223 (e.g., see FIG. 2C).

FIG. 4E shows the package of FIG. 4D after forming a solder resist layer over a final layer of conductive material (and optionally dielectric material) in a standard package pitch zone and a reduced pitch zone. FIG. 4E shows the package of FIG. 4D after forming resist 116 onto (e.g., over and in direct contact with or touching) contacts 110 (e.g., upon side surfaces and partially covering a top surface of contacts 110) and surface 106 in zone 102; and resist 119 onto stacks 436-437 and interconnects 438-439 (e.g., upon side surfaces and partially covering a top surface of stacks 436-437 and interconnects 438-439) and a top surface of dielectric 420 in zone 104. Masks 410, and 312-315 are removed prior to forming resists 116 (and 119). Resists 116 and 119 have openings 117 and 118, respectively. Solder resist 116, resist 119, openings 117 and openings 118 may be as described for FIG. 1, 2G, or 3D.

Solder resist 119 may have height (e.g., thickness), H8, above and may expose the top surface of stacks 436-437 and interconnects 438-439. Openings 118 may have a lower width of W8 and an upper width of W9. In some cases, in FIG. 4E, width W8 may be the same as width W10 over or at contacts 251 and 254; or may be width W11 over or at contact 253.

Resists 116 and 119; and openings 117 and 118 may be formed at the same time or during the same processing processes. In some cases, resist 116, resist 119, openings 117 and openings 118 may all be formed by a process known for forming pitch 111 and/or using a chip POR; however, resist 116 and openings 117 may be formed with pitch 109 while resist 119 and openings 118 are formed with pitch 111.

In some cases, FIGS. 4A-E describe a derivative of FIG. 3A-E, where some capacitors (e.g., stacks 436-437) can also be built on some of contacts 110 (e.g., the C4 pads) to provide some extra power delivery impetus. In some cases, FIGS. 4A-E describe a schematic process flow to enable the capacitors on the selective C4 pads along with high density traces (e.g., interconnects 438-439).

In some cases, any or all of height H1-H9 may be between 3 and 5 percent less than or greater than that described herein (e.g., see FIG. 5 also). In some cases, they may be between 5 and 10 percent less than or greater than that described herein.

In some cases, any or all of widths W1-W17 may represent a circular diameter, or the maximum width (maximum distance from one edge to another farthest edge from above) of an oval, a rectangle, a square, a triangle, a rhombus, a trapezoid, or a polygon.

FIG. 5 shows some examples for the height, or thicknesses of the various layers of various embodiments, as shown in FIGS. 1-4. In some cases, FIG. 5 gives some example heights or thicknesses in micrometers of the standard package pitch sized features or layers of zone 102, and for the standard package pitch sized features as well as smaller processor or reduced pitch sized features of hybrid zone 104. In some cases, the heights in FIG. 5 are for layers of layers 105, 107, 305 and 405. In some cases, the heights in FIG. 5 are for layers of layers 105. In some cases, FIG. 5 may describe a stack-up analysis of the last build-up (BU) layer in the package/substrate and backend. In some cases, for hybrid area (zone) 104 the stackup is provided for four layers, each of metal and having 2 micrometers height and an around a 6 micrometers height Cu contact/solder pad.

In the "zone 102" column, the heights refer to features such as contacts, interconnects, layers, openings, solder resists, having pitch 109 and formed in zone 102 and in certain lower layers of hybrid zone 104. However, in the "zone 104" column, the heights refer to features such as layers, contacts, traces, interconnects, capacitor layers, capacitor stacks, and solder resists formed only in zone 104 and having pitch 111. The first row in the table is an example of height H1 such as a height for contact 110 which may be a layer of build up copper having pitch 109. The second row gives an example of height H2, such as the height for interconnect contact 112 which may be a layer of build up ABF having pitch 109. The third row gives an example of a height of a lower most dielectric layer such as a passivation layer of nitride material which may be an embodiment of layer 120, 320, or 420 having pitch 111. The fourth row gives an example of a total height for multiple layers of conductor material such as sputtered copper layers which may be embodiments of layers, contacts of layers, traces of layers, or capacitor electrodes of layers 121, 212-216, 321, and 421 having pitch 111. The fifth row gives examples of a total height for multiple layers of dielectric material such as ALD or CVD formed silicon nitride (SiN) or silicon dioxide (SiO2) layers which may be embodiments of layers, masks of layers, insulation of layers, capacitor dielectric of layers 122, 322, and 422 having pitch 111. The sixth row gives an example of height H7, such as a height of a top layer of an interconnect or capacitor stack of conductor material having pitch 111, and onto which solder is formed or a contact of a die or chip is soldered onto. H7 may be a height of a contact pad in a reduced pitch zone to which a feature having a pitch of a feature within a chip can be soldered too. The seventh row gives an example of height H4 (which may have pitch 109) and H8 (which may have pitch 111) for solder resist formed in zone 102 and 104, and having a height extending above contacts 110 or an interconnect or capacitor top layer formed in zone 104.

In some embodiments, the total height of the features in zone 102 and 104 is the same from the bottom of layer 110 (e.g., from surface 106 of dielectric 103) extending upward to the top surface of the solder resist (e.g., 116 and 119). It is noted that the height of the solder resist in zone 102 may be greater than that of zone 104. It is noted that in some embodiments, the total height in zone 102 and zone 104 of H1 minus (H4 or H8) may be 58 micrometers.

It can be appreciated that FIG. 5 gives one example of such heights, while other embodiments may have different heights. In some cases, the layers of layers 105 have a height (e.g., thickness) that is within 5 percent (e.g., 5 percent greater to 5 percent less than that) of those described in FIG. 5. In some cases, the layers of layers 105 have a height that is within 10 percent of those described in FIG. 5. In some cases, the layers of layers 105 have a height that is within 20 percent of those described in FIG. 5.

Figure 6:
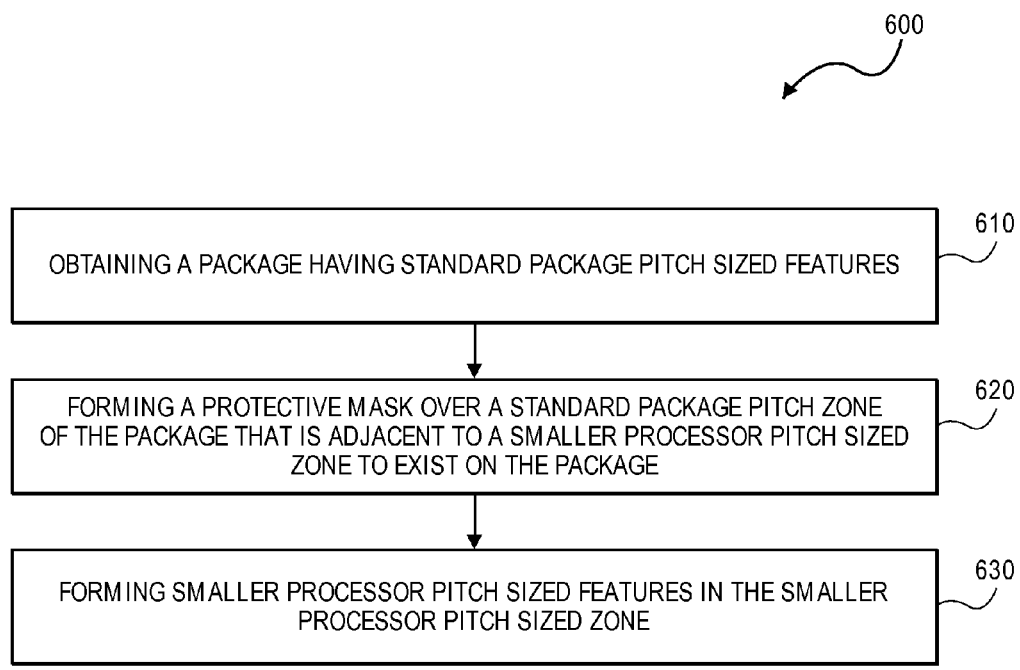
FIG. 6 is a flow chart illustrating a process for forming a hybrid pitch package, according to embodiments described herein.

FIG. 6 is a flow chart illustrating a process for forming a hybrid pitch package, according to embodiments described herein. FIG. 6 shows process 600 which may be a process for forming embodiments described herein of package 100, or package 200 of any of FIGS. 2C-2G, or package 300 of any of FIGS. 3B-3E, or package 400 of any of FIGS. 4C-4E. In some cases, process 600 is a process for forming a hybrid pitch package that includes a standard package pitch zone 102 of the package having only standard package pitch sized features that is adjacent to a smaller processor pitch sized zone 104 of the package having smaller processor pitch sized features.

Process 600 begins at optional block 610 at which a package having standard package pitch sized features is obtained. In some cases, the obtained package is received from a source, manufacturer or producer with only standard package pitch sized features, features having pitch 109, or features formed from a standard package POR. Block 610 may include obtaining package 100 prior to forming any of layers 107 or resist 119; or package 200 of any of FIGS. 2A-2B, or package 300 of FIG. 3A, or package 400 of FIG. 4A. In some cases, the package may be cored or coreless. In some cases, the obtained package includes features such as conductive package upper contacts formed on conductive via contacts which are formed on conductive lower contacts which may be attached or electrically coupled other features of the package. In some cases, the features of the obtained package were formed according to standard package POR and have pitch 109. In some cases, each feature has a height of at least 10 micrometers.

Block 610 may include obtaining a package such by receiving a package at a location, building, city block, city or company that is from a different location, building, city block, city or company, respectively. In some cases obtaining a package may include receiving a package purchased from a package source or vendor. In some cases obtaining a package may include receiving a package having standard package pitch sized features from a package processing facility or a different location than the one the block 630 is performed at, such as from a location that is not a chip fabrication processing facility. In some cases obtaining a package includes receiving at one location or building of a facility, a package that was manufactured at a different location or building of the same facility. In some cases obtaining a package includes receiving a package or panel from a low cost package supplier. In some cases, the obtained package only includes features formed according to a standard package substrate formation processes and tools such as those that include or use: lamination of dielectric layers such as ajinomoto build up films (ABF), laser or mechanical drilling to form vias in the dielectric films, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic device package or a microprocessor package.

After obtaining such a package, the package can be processed to form the hybrid and back-end zone 104, such as to form layers 107, 307 or 407. This processing may include forming in zone 104 layers having pitch 111, using a chip POR, or at a facility or building that provide chip pitch processing.

After block 610, at optional block 620, a protective mask is formed over a standard package pitch zone of the package that is adjacent to a smaller processor pitch sized zone (or a hybrid zone) to exist on the package.

Block 620 may include forming a protective mask, mask 210, mask 310 or mask 410 over a surface (and optionally features in) a standard package pitch zone 102, such as described for FIG. 1A, 2A, 3A or 4A, respectively. The mask may protect the standard package pitch zone during further processing to create smaller processor pitch sized features or layers having pitch 111, such as using a chip POR. In some cases, block 620 includes removing all or a portion of a height of at least one top or upper contact (e.g., contact 110) in the standard pitch zone prior to forming the protective mask (e.g., see FIG. 2B or 4B).

After block 620, at block 630, smaller processor pitch sized features are formed in the smaller processor pitch sized zone. In some cases, block 630 includes forming any or all features of layers 107, 307 or 407 of FIGS. 1-4E. In some cases, block 630 includes processing the package obtained at block 610 to form the hybrid and back-end zone 104, such as to form layers 107, 307 or 407. This processing may include forming in zone 104 layers having pitch 111, using a chip POR, or at a facility or building that provide chip pitch processing. In some cases, block 630 includes forming any or all of features 120, 121, 122 123 or 119 of FIG. 1; any or all of layers 212-218, resist 119, or features (e.g., contacts, traces and interconnects) thereof of FIGS. 2C-G; any or all of layer 320, interconnects 336-339, resist 119, or features (e.g., contacts, traces and interconnects) thereof of FIGS. 3B-E; or any or all of layer 420, capacitors 436-437, interconnects 438-439, resist 119, or features (e.g., contacts, traces and interconnects) thereof of FIGS. 4C-E; or any or all of layer 420, capacitors 436-437.

In some cases, block 630 includes forming smaller processor pitch sized features such as contacts, traces and interconnects in the smaller processor pitch sized zone at a chip fabrication processing facility. The smaller processor pitch sized features can be directly connected to (thus reducing the package connection area needed) a chip or device having processor pitch sized features (e.g., exposed contacts).

In some cases, block 620 or 630 include providing a smooth surface of zone 104 on top of the of the regular ABF surface (e.g., top surface of contact 112) which is conductive to finer DR, prior to forming the layers having pitch 111 in block 630. In some cases, block 620 or 630 include further passivating the ABF surface of zone 104 using either two types of dielectrics (DE), such as a layer of silicon nitride that is 200 nm thick, prior to forming the layers having pitch 111 in block 630. In some cases, the smooth surface or passivating layer is SiN having a roughness of less than 10 nm, or a roughness that is adequate to create sputter copper traces on top of it.

In some cases, block 630 includes forming any or all of conductive upper contacts; conductive traces, layers of conductive material, layers of dielectric material, layers of combined conductive and dielectric material, and layers that form capacitors. In some cases, these features are formed according to chip POR and have pitch 111. In some cases, each feature has a height of less than 10 micrometers.

The lowest of these may be formed directly onto or touching a portion or an original height of an upper contact, a top surface of a conductive via contact, or a dielectric layer of a lower layer (e.g., having pitch 109) of the package.

In some cases, block 630 includes forming in zone 104, a combination of any or all of the features having pitch 111 or using a chip POR. This may include forming in zone 104, a combination (e.g., vertically stacked and/or horizontally adjacent) of any or all of features 120, 121, 122 123 or 119 of FIG. 1; with any or all of layers 212-218, resist 119, or features (e.g., contacts, traces and interconnects) thereof of FIGS. 2C-G; with any or all of layer 320, interconnects 336-339, resist 119, or features (e.g., contacts, traces and interconnects) thereof of FIGS. 3B-E; with any or all of layer 420, capacitors 436-437, interconnects 438-439, resist 119, or features (e.g., contacts, traces and interconnects) thereof of FIGS. 4C-E; or any or all of layer 420, capacitors 436-437.

In some cases, after block 630, zone 102 may have only standard package pitch sized features; while (hybrid) zone 104 has some standard package pitch sized features as well as smaller processor or reduced pitch sized features. In some cases, such features in hybrid zone 104 may include conductive upper contacts, via contacts, and lower contacts; conductive traces, layers of conductive material, layers of dielectric material, layers of combined conductive and dielectric material, layers that form capacitors, and the like.

In some cases, only block 630 is performed. In other cases, only blocks 620-630 are performed. In some cases, block 620 may be performed at the "other" location or vendor of block 610, and the obtained package at block 610 is received with the mask already formed. In this case, only blocks 610 and 630 are preformed.

It can be appreciated that process 600 (or processes described for FIGS. 1-5) may provide a more manufacturing flexible by forming the substrate panels to last BU having pitch 109 in zones 102 and 104 (e.g., block 610 and optionally 620); and then bringing them to another facility for hybrid area 104 processing to form features with pitch 111 (block 630).

It can be appreciated that process 600 (or processes described for FIGS. 1-5) may provide a modified process flow, specifically adjusted and divided into two parts (e.g., divided between block 610 and 620; or between block 620 and 630) to take advantage of two geographical sites (e.g., a chip processing company's internal manufacturing capabilities for hybrid areas, and a package suppliers' facilities for standard package).

In some cases, embodiments of process 600, a process for forming package 100, a process for forming package 200 of any of FIGS. 2C-2G, a process for forming package 300 of any of FIGS. 3B-3E, a process for forming package 400 of any of FIGS. 4C-4E may describe embodiments of processes for forming a "hybrid pitch package." In some cases, embodiments of a device as described for package 100, package 200 of any of FIGS. 2C-2G, package 300 of any of FIGS. 3B-3E, or package 400 of any of FIGS. 4C-4E may describe embodiments of a "hybrid pitch package."

In some cases, embodiments of processes for forming a "hybrid pitch package" or embodiments of a "hybrid pitch package" device (e.g., devices, systems and processes for forming) provide a top interconnect layer with a standard package pitch zone 102 adjacent to reduced pitch zone 104 formed upon the same substrate and having lower layers with standard package pitch features and top layers with reduced pitch features to which an IC chip may be directly attached. In some cases, embodiments of such processes and devices provide all the benefits of a silicon interposer and a silicon bridge, while having a lower cost manufacturing process that can use computer processor fabrication processing, processes and facilities to enable ultra-high density interconnect across the package (e.g., board), from standard package pitch sized features to smaller processor or reduced pitch sized features.

In some cases, embodiments of processes for forming a "hybrid pitch package" or embodiments of a "hybrid pitch package" provide the benefits embodied in computer system architecture features and interfaces made in high volumes. In some cases, embodiments of such processes and devices provide all the benefits of solving very high density interconnect problems, such as across client and server (e.g., where hundreds even thousands of signals between two die need to be routed), in deep path-finding, or for high density interconnection within a system on a chip (SoC). In some cases, embodiments of such processes and devices provide the demanded lower cost high density interconnects solution that is needed across the above segments. Under certain cases, embodiments provide slightly lower interconnect density than the peak capability at a lower cost.

In some cases, embodiments of processes for forming a "hybrid pitch package" or embodiments of a "hybrid pitch package" provide ultra-high density interconnect in a standard package, such as a flip-chip x grid array (FCxGA), where 'x' can be ball, pin, or land, or a flip-chip chip scale package (FCCSP, etc) by using a hybrid manufacturing process (e.g., standard package and chip processing), essentially combining the high density and standard density packaging into a single hybrid package entity. In addition to this, such processes and devices can provide for local power delivery, directly in the hybrid area through vias connected to BGA/LGA (e.g., see contact 123 or 253) while other technologies such as a silicon-bridge may not be capable of providing power in the bridge area. In some cases, embodiments of such processes and devices provide an approach to provide finer line and spacing (e.g., <3 micrometer line and spacing) and design rules (DR) locally by creating the hybrid package from a standard package.

In some cases, embodiments of such processes and devices include obtaining substrates (e.g., packages) that are completed to the final build-up (BU) layers (e.g., layers 105) and then the hybrid process is applied to only a selective hybrid area (e.g., zone 104). The hybrid area will contain very fine line and space (e.g., 2/2 micrometers). In some cases, embodiments of such processes and devices include testing each of the obtained packages (e.g., in the panel) to ensure good a substrate prior to applying the hybrid process (e.g., to create layers with pitch 111) to make the process more cost effective. In some cases, this hybrid process is die-backend-like; and enables tiny features required for ultra-high density interconnect.

In some cases, embodiments of such processes and devices provide integration of board ICs including memory, modem, graphics, and other functionality, directly attached to a package that was originally a standard package. These processes and devices provide increased input/output (IO) density at lower cost.

According to some embodiments, a hybrid package can include two zones 104 to be used for die-to-die connections needing massive bandwidth, instead of using zones 102. For example, a 1024 bit bus of the package that will be used to transmit signals between the two die. The die could be connected using zones 102 with a standard package pitch 109 of about a 100 µm pitch for the 1024 bumps of those 1024 bits/busses. If the 1024 bumps for those 1024 bits/ busses are put into a 128×8 field bump pattern, the dimension of this bump field would be 700×12700 µm from bump center to bump center. That is an area of 8.89 mm².

However, using a hybrid package, the die can be connected using zones 104 with a reduced pitch 111 of about a 25 µm pitch for the 1024 bumps of those 1024 bits/busses. In this case the 1024 bumps put into the 128×8 field bump pattern, now are a bump field of only 175×3175 µm, which is an area of only 0.56 mm². This saves at least 10 times the area that would be required using zones 102.

Figure 7:
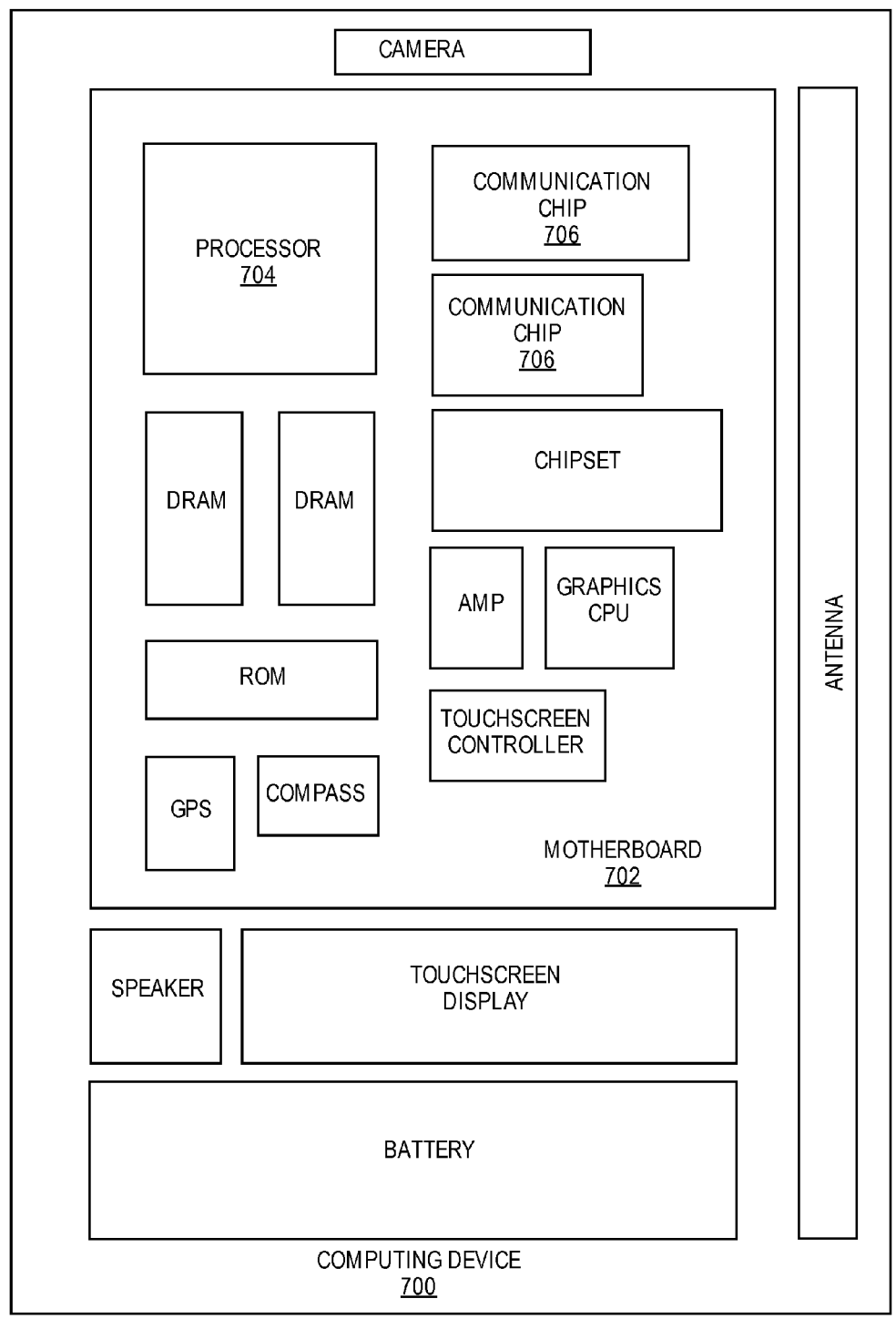
FIG. 7 illustrates a computing device in accordance with one implementation.

FIG. 7 illustrates a computing device in accordance with one implementation. FIG. 7 illustrates computing device 700 in accordance with one implementation. Computing device 700 houses board 702. Board 702 may include a number of components, including but not limited to processor 704 and at least one communication chip 706. Processor 704 is physically and electrically coupled to board 702. In some implementations at least one communication chip 706 is also physically and electrically coupled to board 702. In further implementations, communication chip 706 is part of processor 704.

Depending on its applications, computing device 700 may include other components that may or may not be physically and electrically coupled to board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, first communication chip 706 may be dedicated to shorter range wireless communications such as Wi-Fi and Bluetooth and second communication chip 706 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. In some implementations, the integrated circuit die of the processor includes one or more devices, such as transistors or metal interconnects. In some embodiments, the package of the integrated circuit die or processor 704 includes embodiments of processes for forming a "hybrid pitch package" or embodiments of a "hybrid pitch package" as described herein. The term "processor" may refer to any device or portion of a device that processes electronic data from registers and/or memory to transform that electronic data into other electronic data that may be stored in registers and/or memory.

Communication chip 706 also includes an integrated circuit die packaged within communication chip 706. In accordance with another implementation, the integrated circuit die of the communication chip includes one or more devices, such as transistors or metal interconnects. In some embodiments, the package of the integrated circuit die or chip 706 includes embodiments of processes for forming a "hybrid pitch package" or embodiments of a "hybrid pitch package" as described herein.

In further implementations, another component housed within computing device 700 may contain an integrated circuit die that includes one or more devices, such as transistors or metal interconnects. In some embodiments, the package of the other integrated circuit die or chip includes embodiments of processes for forming a "hybrid pitch package" or embodiments of a "hybrid pitch package" as described herein.

In various implementations, computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 700 may be any other electronic device that processes data.

EXAMPLES

The following examples pertain to embodiments.

Example 1 is a method of forming a hybrid pitch package including obtaining a package having standard package pitch sized features; forming a protective mask over a standard package pitch zone of the package that is adjacent to a smaller processor pitch sized zone on the package; and forming smaller processor pitch sized features in the smaller processor pitch sized zone.

In Example 2, the subject matter of Example 1 can optionally include wherein the smaller processor pitch sized features have a pitch at least three times smaller than that of the standard package pitch sized features.

In Example 3, the subject matter of Example 1 can optionally include wherein the smaller processor pitch sized features have a bump pitch of between 10 and 50 micrometers and the standard package pitch sized features have a bump pitch of between 100 micrometers and 200 micrometers.

In Example 4, the subject matter of Example 1 can optionally include wherein the standard package pitch sized features include conductive package upper contacts formed on conductive via contacts which are formed on conductive lower contacts, and wherein forming smaller processor pitch sized features includes removing all or a portion of a height of at least one upper contact from over at least one conductive via contact in the smaller processor pitch sized zone.

In Example 5, the subject matter of Example 1 can optionally include wherein the standard package pitch sized features are formed according to standard package POR and include conductive upper contacts having a height of at least 10 micrometers; and wherein forming smaller processor pitch sized features includes forming features according to a chip POR and having a height of less than 10 micrometers.

In Example 6, the subject matter of Example 5 can optionally include wherein forming smaller processor pitch sized features includes forming dielectric layers having a thickness of between 0.1 and 0.3 micrometers, and conductive material layers having a thickness of between 1 and 3 micrometers; and wherein the dielectric layers are formed by atomic layer deposition (ALD) and wherein the conductive material layers are formed by CVD deposition.

In Example 7, the subject matter of Example 1 can optionally include wherein the standard package zone has only standard package pitch sized features, and the reduced pitch size zone has reduced pitch sized features formed over standard package pitch sized features.

In Example 8, the subject matter of Example 1 can optionally include wherein obtaining the package substrate includes receiving the obtaining a package substrate from a location that is different than the location where forming occurs.

In Example 9, the subject matter of Example 1 can optionally include wherein forming smaller processor pitch sized features includes removing a first upper contact from over a conductive via contact that is below the upper contact; forming alternating layers of only dielectric material and only conductive material over the conductive via using a chip POR and having a reduced pitch; wherein the alternating layers of dielectric material have a thickness of between 0.1 and 0.3 micrometers, and the alternating layers of conductive material have a thickness of between 1 and 3 micrometers; and wherein the dielectric layers are formed by atomic layer deposition (ALD) and the conductive material layers are formed by CVD deposition.

In Example 10, the subject matter of Example 1 can optionally include wherein forming smaller processor pitch sized features includes removing a first upper contact from over a conductive via contact that is below the upper contact; forming patterned layers of combined dielectric material and conductive material over the conductive via using a chip POR and having a reduced pitch; wherein the patterned layers have a thickness of between 1 and 3 micrometers; and wherein the patterned layers include one of conductive upper contacts, conductive traces, or layers that form capacitors.

Example 11 is a hybrid pitch package including a standard package pitch zone of the package that is adjacent to a smaller processor pitch sized zone of the package; the standard package pitch zone having only standard package pitch sized features; and the smaller processor pitch sized zone having smaller processor pitch sized features.

In Example 12, the subject matter of Example 11 can optionally include wherein one of (1) the smaller processor pitch sized features have a pitch at least three times smaller than that of the standard package pitch sized features; or (2) the smaller processor pitch sized features have a bump pitch of between 10 and 50 micrometers and the standard package pitch sized features have a bump pitch of between 100 micrometers and 200 micrometers.

In Example 13, the subject matter of Example 11 can optionally include wherein the smaller processor pitch sized features are formed on a conductive via or a portion of a height of at least one upper contact having a standard package pitch size.

In Example 14, the subject matter of Example 11 can optionally include wherein the standard package pitch sized features include conductive upper contacts having a height of at least 10 micrometers; and wherein the smaller processor pitch sized features have a height of less than 10 micrometers.

In Example 15, the subject matter of Example 14 can optionally include wherein the smaller processor pitch sized features include dielectric layers having a thickness of between 0.1 and 0.3 micrometers, and conductive material layers having a thickness of between 1 and 3 micrometers.

In Example 16, the subject matter of Example 11 can optionally include wherein the standard package zone has only standard package pitch sized features, and the reduced pitch size zone has reduced pitch sized features formed over standard package pitch sized features.

In Example 17, the subject matter of Example 11 can optionally include wherein the smaller processor pitch sized features include alternating layers of only dielectric material and only conductive material having a reduced bump pitch over a conductive via having a standard package bump pitch; wherein the alternating layers of dielectric material have a thickness of between 0.1 and 0.3 micrometers, and the alternating layers of conductive material have a thickness of between 1 and 3 micrometers.

In Example 18, the subject matter of Example 11 can optionally include wherein the smaller processor pitch sized features include patterned layers of combined dielectric material and conductive material having a reduced bump pitch over a conductive via having a standard package bump pitch; wherein the patterned layers have a thickness of between 1 and 3 micrometers; and wherein the patterned layers include one of conductive upper contacts; conductive traces, or layers that form capacitors.

Example 19 is a system for computing including an integrated chip mounted on a hybrid pitch package, the hybrid pitch package including a standard package pitch zone of the package that is adjacent to a smaller processor pitch sized zone of the package; the standard package pitch zone having only standard package pitch sized features; and the smaller processor pitch sized zone having smaller processor pitch sized features, wherein the integrated chip includes processor pitch sized contacts directly connected to processor pitch sized contacts of the processor pitch sized zone.

In Example 20, the subject matter of Example 19 can optionally include wherein one of (1) the smaller processor pitch sized features have a pitch at least three times smaller than that of the standard package pitch sized features; or (2) the smaller processor pitch sized features have a bump pitch of between 10 and 50 micrometers and the standard package pitch sized features have a bump pitch of between 100 micrometers and 200 micrometers.

In Example 21, the subject matter can optionally include an apparatus including means for performing the method of any one of Examples 1-10.

The above description of illustrated implementations, including what is described in the Abstract, is not intended to be exhaustive or to limit the embodiments of invention to the precise forms disclosed. While specific implementations of, and examples for, embodiments of the invention are described herein for illustrative purposes, various equivalent modifications are possible within the scope, as those skilled in the relevant art will recognize. These modifications may be made to embodiments of the invention in light of the above detailed description. For example, although the descriptions above show only a single side or surface of a package, those descriptions can apply to processing multiple adjacent packages; or a top and bottom of a single package (e.g., cored package) at one time.

The terms used in the following claims should not be construed to limit embodiments of the invention to the specific implementations disclosed in the specification and the claims. Rather, the scope is to be determined entirely by the following claims, which are to be construed in accordance with established doctrines of claim interpretation.

The invention claimed is:

1. A method of forming a hybrid pitch package comprising:
   obtaining a package having only standard package pitch sized features in a standard package pitch zone of the package and in a smaller processor pitch sized zone of the package; then
   forming a protective mask over the standard package pitch zone of the package that is adjacent to the smaller processor pitch sized zone of the package; and then
   forming smaller processor pitch sized features in the smaller processor pitch sized zone, wherein the smaller processor pitch sized features have a pitch at least three times smaller than that of the standard package pitch sized features.

2. The method of claim 1, wherein the smaller processor pitch sized features have a bump pitch of between 10 and 50 micrometers and the standard package pitch sized features have a bump pitch of between 100 micrometers and 200 micrometers.

3. The method of claim 1, wherein the standard package pitch sized features include conductive package upper contacts formed on conductive via contacts which are formed on conductive lower contacts, and wherein forming smaller processor pitch sized features includes removing all or a portion of a height of at least one upper contact from over at least one conductive via contact in the smaller processor pitch sized zone.

4. The method of claim 1, wherein the standard package pitch sized features are formed according to standard package POR and include conductive upper contacts having a height of at least 10 micrometers; and wherein forming smaller processor pitch sized features includes forming features according to a chip POR and having a height of less than 10 micrometers.

5. The method of claim 4, wherein forming smaller processor pitch sized features includes forming dielectric layers having a thickness of between 0.1 and 0.3 micrometers, and conductive material layers having a thickness of between 1 and 3 micrometers; and wherein the dielectric layers are formed by atomic layer deposition (ALD) and wherein the conductive material layers are formed by chemical vapor deposition (CVD).

6. The method of claim 1, wherein the standard package zone has only standard package pitch sized features, and the reduced pitch size zone has reduced pitch sized features formed over standard package pitch sized features.

7. The method of claim 1, wherein obtaining the package includes receiving the obtaining a package substrate from a location that is different than the location where forming occurs.

8. The method of claim 1, wherein forming smaller processor pitch sized features includes:
   removing a first upper contact from over a conductive via contact that is below the upper contact;
   forming alternating layers of only dielectric material and only conductive material over the conductive via using a chip POR and having a reduced pitch;
   wherein the alternating layers of dielectric material have a thickness of between 0.1 and 0.3 micrometers, and the alternating layers of conductive material have a thickness of between 1 and 3 micrometers; and
   wherein the dielectric layers are formed by atomic layer deposition (ALD) and the conductive material layers are formed by chemical vapor deposition (CVD).

9. The method of claim 1, wherein forming smaller processor pitch sized features includes:
   removing a first upper contact from over a conductive via contact that is below the upper contact;
   forming patterned layers of combined dielectric material and conductive material over the conductive via using a chip POR and having a reduced pitch;
   wherein the patterned layers have a thickness of between 1 and 3 micrometers; and
   wherein the patterned layers include one of conductive upper contacts, conductive traces, or layers that form capacitors.

10. A hybrid pitch package comprising:
    a standard package pitch zone of the package that is adjacent to a smaller processor pitch sized zone of the package;
    the standard package pitch zone having only standard package pitch sized features; and
    the smaller processor pitch sized zone having smaller processor pitch sized features formed over standard package pitch sized features, wherein the smaller processor pitch sized features have a pitch at least three times smaller than that of the standard package pitch sized features.

11. The package of claim 10, wherein the smaller processor pitch sized features have a bump pitch of between 10 and 50 micrometers and the standard package pitch sized features have a bump pitch of between 100 micrometers and 200 micrometers.

12. The package of claim 10, wherein the smaller processor pitch sized features are formed on a conductive via or a portion of a height of at least one upper contact having a standard package pitch size.

13. The package of claim 10, wherein the standard package pitch sized features include conductive upper contacts having a height of at least 10 micrometers; and wherein the smaller processor pitch sized features have a height of less than 10 micrometers.

14. The package of claim 13, wherein the smaller processor pitch sized features include dielectric layers having a thickness of between 0.1 and 0.3 micrometers, and conductive material layers having a thickness of between 1 and 3 micrometers.

15. The package of claim 10, wherein the standard package zone has only standard package pitch sized features, and the reduced pitch size zone has reduced pitch sized features formed over standard package pitch sized features.

16. The package of claim 10, wherein the smaller processor pitch sized features include:
   alternating layers of only dielectric material and only conductive material having a reduced bump pitch over a conductive via having a standard package bump pitch; and
   wherein the alternating layers of dielectric material have a thickness of between 0.1 and 0.3 micrometers, and the alternating layers of conductive material have a thickness of between 1 and 3 micrometers.

17. The package of claim 10, wherein the smaller processor pitch sized features include:
   patterned layers of combined dielectric material and conductive material having a reduced bump pitch over a conductive via having a standard package bump pitch;
   wherein the patterned layers have a thickness of between 1 and 3 micrometers; and
   wherein the patterned layers include one of conductive upper contacts; conductive traces, or layers that form capacitors.

18. A system for computing comprising:
   an integrated chip mounted on a hybrid pitch package, the hybrid pitch package including:
      a standard package pitch zone of the package that is adjacent to a smaller processor pitch sized zone of the package;
      the standard package pitch zone having only standard package pitch sized features; and
      the smaller processor pitch sized zone having smaller processor pitch sized features formed over standard package pitch sized features, wherein the smaller processor pitch sized features have a pitch at least three times smaller than that of the standard package pitch sized features.

19. The system of claim 18, wherein the smaller processor pitch sized features have a bump pitch of between 10 and 50 micrometers and the standard package pitch sized features have a bump pitch of between 100 micrometers and 200 micrometers.

20. The method of claim 1, wherein the smaller processor pitch sized features and the standard package pitch sized features are surface contacts upon which solder balls can be formed.

21. The package of claim 10, wherein the smaller processor pitch sized features and the standard package pitch sized features are surface contacts upon which solder balls can be formed.

22. The system of claim 18, wherein the smaller processor pitch sized features and the standard package pitch sized features are surface contacts upon which solder balls can be formed.

* * * * *